(12) United States Patent
Forbes Jones

(10) Patent No.: US 7,803,211 B2
(45) Date of Patent: *Sep. 28, 2010

(54) METHOD AND APPARATUS FOR PRODUCING LARGE DIAMETER SUPERALLOY INGOTS

(75) Inventor: Robin M. Forbes Jones, Charlotte, NC (US)

(73) Assignee: ATI Properties, Inc., Albany, OR (US)

( * ) Notice: Subject to any disclaimer, the term of this patent is extended or adjusted under 35 U.S.C. 154(b) by 188 days.

This patent is subject to a terminal disclaimer.

(21) Appl. No.: 12/053,238

(22) Filed: Mar. 21, 2008

(65) Prior Publication Data

US 2008/0179033 A1 Jul. 31, 2008

Related U.S. Application Data

(63) Continuation-in-part of application No. 11/232,702, filed on Sep. 22, 2005, now Pat. No. 7,578,960.

(60) Provisional application No. 60/909,118, filed on Mar. 30, 2007.

(51) Int. Cl.
*B22F 9/14* (2006.01)

(52) U.S. Cl. .......................... 75/336; 75/338

(58) Field of Classification Search ........................ None
See application file for complete search history.

(56) References Cited

U.S. PATENT DOCUMENTS

| | | |
|---|---|---|
| 3,005,246 A | 10/1961 | Murphy et al. |
| 3,072,982 A | 1/1963 | Gordon et al. |
| 3,101,515 A | 8/1963 | Hanks |
| 3,389,208 A | 6/1968 | Roberts et al. |
| 3,420,977 A | 1/1969 | Hanks et al. |

(Continued)

FOREIGN PATENT DOCUMENTS

CA 2048836 3/1983

(Continued)

OTHER PUBLICATIONS

D.E. Tyler and W.G. Watson, "Nucleated Casting", *Proceedings of the Third International Conference on Spray Forming*, Sep. 1996, pp. 233-242.

(Continued)

*Primary Examiner*—George Wyszomierski
(74) *Attorney, Agent, or Firm*—Kirkpatrick & Lockhart Preston Gates Ellis LLP; Patrick J. Viccaro; John E. Grosselin, III

(57) ABSTRACT

Methods and apparatus for producing large diameter superalloy ingots are disclosed. A material comprising at least one of a metal and a metallic alloy is introduced into a pressure-regulated chamber in a melting assembly. The material is subjected to a wide-area electron field within the pressure-regulated chamber to heat the material to a temperature above the melting temperature of the material to form a molten alloy. At least one stream of molten alloy from the pressure-regulated chamber is provided from the melting assembly and is fed into an atomizing assembly, where particles of the molten alloy are generated by impinging electrons on the molten alloy to atomize the molten alloy. At least one of an electrostatic field and an electromagnetic field are produced to influence the particles of the molten alloy. The particles of the molten alloy are deposited onto a collector in a spray forming operation to form an alloy ingot.

29 Claims, 20 Drawing Sheets

U.S. PATENT DOCUMENTS

| | | |
|---|---|---|
| 3,519,059 A | 7/1970 | Voskoboinikov et al. |
| 3,547,622 A | 12/1970 | Hutchinson |
| 3,576,207 A | 4/1971 | Grenfell et al. |
| 3,627,293 A | 12/1971 | Sperner |
| 3,690,635 A | 9/1972 | Harker et al. |
| 3,737,305 A | 6/1973 | Blayden et al. |
| 3,817,503 A | 6/1974 | Lafferty et al. |
| 3,825,415 A | 7/1974 | Johnston et al. |
| 3,826,301 A | 7/1974 | Brooks |
| 3,868,987 A | 3/1975 | Galey et al. |
| 3,896,258 A | 7/1975 | Hanks |
| 3,909,921 A | 10/1975 | Brooks |
| 3,970,892 A | 7/1976 | Wakalopulos |
| 3,972,713 A | 8/1976 | Muzyka et al. |
| 3,985,177 A | 10/1976 | Buehler |
| 3,988,084 A | 10/1976 | Esposito et al. |
| 3,989,091 A | 11/1976 | Medovar et al. |
| 4,025,818 A | 5/1977 | Giguere et al. |
| 4,058,697 A | 11/1977 | Sokolov et al. |
| 4,062,700 A | 12/1977 | Hayami et al. |
| 4,066,117 A | 1/1978 | Clark et al. |
| 4,136,527 A | 1/1979 | Kading |
| 4,190,404 A | 2/1980 | Drs et al. |
| 4,221,587 A | 9/1980 | Ray |
| 4,261,412 A | 4/1981 | Soykan et al. |
| 4,264,641 A | 4/1981 | Mahoney et al. |
| 4,272,463 A | 6/1981 | Clark et al. |
| 4,305,451 A | 12/1981 | Ksendzyk et al. |
| 4,343,433 A * | 8/1982 | Sickles .................. 239/3 |
| 4,426,141 A | 1/1984 | Holcomb |
| 4,441,542 A | 4/1984 | Pryor et al. |
| 4,449,568 A | 5/1984 | Narasimham |
| 4,471,831 A | 9/1984 | Ray |
| 4,482,376 A | 11/1984 | Tarasescu et al. |
| 4,544,404 A | 10/1985 | Yolton et al. |
| 4,575,325 A | 3/1986 | Duerig et al. |
| 4,596,945 A | 6/1986 | Schumacher et al. |
| 4,619,597 A | 10/1986 | Miller |
| 4,619,845 A | 10/1986 | Ayers et al. |
| 4,631,013 A | 12/1986 | Miller |
| 4,642,522 A | 2/1987 | Harvey et al. |
| 4,645,978 A | 2/1987 | Harvey et al. |
| 4,689,074 A | 8/1987 | Seaman et al. |
| 4,694,222 A | 9/1987 | Wakalopulos |
| 4,738,713 A | 4/1988 | Stickle |
| 4,755,722 A | 7/1988 | Wakalopulos |
| 4,762,553 A | 8/1988 | Savage et al. |
| 4,762,975 A | 8/1988 | Mahoney et al. |
| 4,769,064 A | 9/1988 | Buss et al. |
| 4,779,802 A | 10/1988 | Coombs |
| 4,786,844 A | 11/1988 | Farrell et al. |
| 4,788,016 A | 11/1988 | Colclough et al. |
| 4,801,411 A | 1/1989 | Wellinghoff et al. |
| 4,801,412 A | 1/1989 | Miller |
| 4,838,340 A | 6/1989 | Entrekin et al. |
| 4,842,170 A | 6/1989 | Del Vacchio et al. |
| 4,842,704 A | 6/1989 | Collins et al. |
| 4,910,435 A | 3/1990 | Wakalopulos |
| 4,916,361 A | 4/1990 | Schumacher et al. |
| 4,919,335 A | 4/1990 | Hobson et al. |
| 4,926,923 A | 5/1990 | Brooks et al. |
| 4,931,091 A | 6/1990 | Waite et al. |
| 4,932,635 A | 6/1990 | Harker |
| 4,938,275 A | 7/1990 | Leatham et al. |
| 4,955,045 A | 9/1990 | Friede et al. |
| 4,961,776 A | 10/1990 | Harker |
| 5,004,153 A | 4/1991 | Sawyer |
| 5,074,933 A | 12/1991 | Ashok et al. |
| 5,084,091 A | 1/1992 | Yolton |
| 5,104,634 A | 4/1992 | Calcote |
| 5,142,549 A | 8/1992 | Bremer |
| 5,160,532 A | 11/1992 | Benz et al. |
| 5,167,915 A | 12/1992 | Yamashita et al. |
| 5,176,874 A | 1/1993 | Mourer et al. |
| 5,222,547 A | 6/1993 | Harker |
| 5,226,946 A | 7/1993 | Diehm et al. |
| 5,240,067 A | 8/1993 | Hatch |
| 5,263,044 A | 11/1993 | Bremer |
| 5,266,098 A * | 11/1993 | Chun et al. .................. 75/335 |
| 5,268,018 A | 12/1993 | Mourer et al. |
| 5,272,718 A | 12/1993 | Stenzel et al. |
| 5,291,940 A | 3/1994 | Borofka et al. |
| 5,296,274 A | 3/1994 | Movchan et al. |
| 5,302,881 A | 4/1994 | O'Loughlin |
| 5,310,165 A | 5/1994 | Benz et al. |
| 5,325,906 A | 7/1994 | Benz et al. |
| 5,332,197 A | 7/1994 | Benz et al. |
| 5,348,566 A | 9/1994 | Sawyer et al. |
| 5,366,206 A | 11/1994 | Sawyer et al. |
| 5,368,897 A | 11/1994 | Kurihara et al. |
| 5,377,961 A | 1/1995 | Smith et al. |
| 5,378,957 A | 1/1995 | Kelly |
| 5,381,847 A | 1/1995 | Ashok et al. |
| 5,384,821 A | 1/1995 | Jedlitschka et al. |
| 5,472,177 A | 12/1995 | Benz et al. |
| 5,480,097 A | 1/1996 | Carter, Jr. et al. |
| 5,489,820 A | 2/1996 | Ivanov et al. |
| 5,503,655 A | 4/1996 | Joseph |
| 5,527,381 A | 6/1996 | Waite et al. |
| 5,649,992 A | 7/1997 | Carter, Jr. et al. |
| 5,649,993 A | 7/1997 | Carter, Jr. et al. |
| 5,683,653 A | 11/1997 | Benz et al. |
| 5,699,850 A | 12/1997 | Beitelman et al. |
| 5,722,479 A | 3/1998 | Oeftering |
| 5,749,938 A | 5/1998 | Coombs |
| 5,749,989 A | 5/1998 | Linman et al. |
| 5,769,151 A | 6/1998 | Carter, Jr. et al. |
| 5,809,057 A | 9/1998 | Benz et al. |
| 5,810,066 A | 9/1998 | Knudsen et al. |
| 5,894,980 A | 4/1999 | Orme-Marmarelis et al. |
| 5,954,112 A | 9/1999 | Forbes Jones et al. |
| 5,985,206 A | 11/1999 | Zabala et al. |
| 6,068,043 A | 5/2000 | Clark |
| 6,103,182 A | 8/2000 | Campbell |
| 6,156,667 A | 12/2000 | Jewett |
| 6,162,377 A | 12/2000 | Ghosh et al. |
| 6,168,666 B1 | 1/2001 | Sun |
| 6,264,717 B1 | 7/2001 | Carter, Jr. et al. |
| 6,350,293 B1 | 2/2002 | Carter, Jr. et al. |
| 6,416,564 B1 | 7/2002 | Bond |
| 6,427,752 B1 | 8/2002 | Carter, Jr. et al. |
| 6,460,595 B1 | 10/2002 | Benz et al. |
| 6,491,737 B2 | 12/2002 | Orme-Marmarelis et al. |
| 6,496,529 B1 | 12/2002 | Forbes Jones et al. |
| 6,562,099 B2 | 5/2003 | Orme-Marmarelis et al. |
| 6,631,753 B1 | 10/2003 | Carter, Jr. et al. |
| 6,772,961 B2 | 8/2004 | Forbes Jones et al. |
| 6,904,955 B2 | 6/2005 | Jackson et al. |
| 6,975,073 B2 | 12/2005 | Wakalopulos |
| 7,033,444 B1 | 4/2006 | Komino et al. |
| 7,114,548 B2 | 10/2006 | Forbes Jones et al. |
| 7,150,412 B2 | 12/2006 | Wang et al. |
| 7,154,932 B2 | 12/2006 | Forbes Jones et al. |
| 7,337,745 B1 | 3/2008 | Komino et al. |
| 7,374,598 B2 | 5/2008 | Forbes Jones et al. |
| 7,439,188 B2 | 10/2008 | DeOrnellas et al. |
| 7,578,960 B2 * | 8/2009 | Forbes Jones et al. ....... 266/202 |
| 2005/0173847 A1 | 8/2005 | Blackburn et al. |
| 2007/0062332 A1 | 3/2007 | Forbes Jones et al. |
| 2007/0151695 A1 | 7/2007 | Forbes Jones et al. |
| 2008/0072707 A1 | 3/2008 | Forbes Jones et al. |
| 2008/0115905 A1 | 5/2008 | Forbes Jones et al. |
| 2008/0179034 A1 | 7/2008 | Forbes Jones et al. |
| 2008/0223174 A1 | 9/2008 | Forbes Jones et al. |

| | | | |
|---|---|---|---|
| 2009/0139682 | A1 | 6/2009 | Forbes Jones et al. |
| 2010/0012629 | A1 | 1/2010 | Forbes Jones et al. |

FOREIGN PATENT DOCUMENTS

| | | | |
|---|---|---|---|
| CA | 2048836 | A1 | 4/1992 |
| DE | 3810294 | | 12/1985 |
| DE | 3810294 | | 10/1988 |
| DE | 4011392 | B4 | 4/2004 |
| EP | 0073585 | A1 | 3/1983 |
| EP | 0095298 | A1 | 11/1983 |
| EP | 0073585 | A1 | 1/1986 |
| EP | 0225732 | B1 | 6/1987 |
| EP | 0400089 | B1 | 10/1988 |
| EP | 0428527 | B1 | 10/1988 |
| EP | 0486830 | A2 | 2/1990 |
| EP | 1101552 | A2 | 2/1991 |
| EP | 0486830 | A2 | 5/1992 |
| EP | 0400089 | B1 | 6/1993 |
| EP | 0428527 | B1 | 8/1996 |
| EP | 1101552 | A2 | 5/2001 |
| GB | 2203889 | A | 10/1988 |
| GB | 2203889 | A | 4/1992 |
| JP | 3-36205 | A | 2/1991 |
| JP | H03-36205 | | 5/1992 |
| RU | 2089633 | C1 | 6/1993 |
| RU | 2089633 | C1 | 9/1997 |
| WO | WO 85/05489 | A1 | 1/1985 |
| WO | WO 85/05489 | A1 | 12/1985 |
| WO | WO 86/00466 | A1 | 1/1986 |
| WO | WO 90/01250 | A1 | 2/1990 |
| WO | WO 97/49837 | A1 | 12/1997 |
| WO | WO 01/96028 | A1 | 12/2001 |
| WO | WO 02/40197 | A2 | 5/2002 |

OTHER PUBLICATIONS

E.J. Lavernia and Y. Wu, "Spray Atomization and Deposition" (John Wiley & Sons, 1996), pp. 311-314.
L.A. Bertram et al., "Quantitative Simulations of a Superalloy VAR Ingot at the Macroscale", *Proceedings of the 1997 International Symposium on Liquid Metal Processing and Casting*, A. Mitchell and P. Auburtin, eds., (Am. Vac. Soc., 1997)., pp. 110-132.
JOM, "Solidification Processing of Materials in Magnetic Fields", copyright held by *The Minerals, Metals & Materials Society*, 1998.
William T. Carter, Jr. and Robin M. Forbes-Jones, "Nucleated Casting for Land-Based Gas Turbines", *Advanced Materials & Processes*, Jul. 2002, pp. 27-29.
Alan Leatham, "Spray Forming: Alloys, Products, and Markets", *JOM-e*, Apr. 1999 (vol. 51, No. 4) 13 pages.
W.T. Carter, Jr. et al. "The CMSF Process: The Spray Forming of Clean Metal", *JOM-e*, Apr. 1999 (vol. 51, No. 4) 7 pages.
William T. Carter, Jr. and Robin M. Forbes-Jones, "Nucleated Casting for the Production pf Large Superalloy Ingots", *JOM*, Apr. 2005, pp. 52-57.
Sears, Francis Weston, An Introduction to Thermodynamics, the Kinetic Theory of Gases, and Statistical Mechanics, 2nd Edition, Addison-Wesley, 1959, pp. 335-337.
Macky, W.A., "Some Investigations on the Deformation of Water Droplets in Strong Electric Fields", Proc. Roy. Soc. London, Series A, 133, pp. 565-587, 1931.
V. A. Chernov, "Powerful High-Voltage Glow Discharge Electron Gun and Power Unit on Its Base," 1994 Intern. Conf. on Electron Beam Melting (Reno, Nevada), pp. 259-267.
H. Duval, et al., "Theoretical and Experimental Approach of the Volatilization in Vacuum Metallurgy," pp. 83-97 (date unknown).
E. M. Oks, et al., "Development of Plasma Cathode Electron Guns," Physics of Plasmas, vol. 6, No. 5, pp. 1649-1654, May 1999.
W. Clark, "Electron Gun Technology," Hughes Research Laboratories, Final Report No. N00014-72-C-0496, 92 pages, Dec. 1976.
"Electron-Beam Melting of Titanium," printed from http://www.antares.com.ua, Internet site, website accessed on Apr. 4, 2007, 6 pages.

ALD Vacuum Technologies AG, "Electron Beam Melting (EB), Electron Beam Melting Processes and Furnaces," 6 pages, (date unknown).
G. Wakalopulos, "Pulsed WIP Electron Gun. Final Report—Fabrication Phase 1×40 cm and 1×70 cm Cooled WIP Electron Gun," Mar. 1979—Dec. 1980.
W. M. Clark, et al., "Ion Plasma Electron Gun Research," Dec. 1977.
G. Sanchez, et al., "Thermal Effect of Ion Implantation with Ultra-Short Ion Beams," Surface and Coatings Technology, vol. 70, pp. 181-186 (1995).
M. L. Sentis, et al., "Parametric Studies of X-Ray Preionized Discharge XeCl Laser at Single Short and at High Pulse Rate Frequency (1 kHz)," J. Appl. Phys., vol. 66, No. 5, pp. 1925-1930, Sep. 1, 1989.
L. Arif, et al., "Waves Behaviour in a High Repetition High Average Power Excimer Laser," SPIE vol. 1031 GCL—Seventh International Symposium on Gas Flow and Chemical Lasers, pp. 392-399 (1988).
N. N. Semashko, "Sources of Gas-Ion Beams with Current up to 60 A for Controlled Thermonuclear Fusion and Technological Applications," Atomic Energy, vol. 82, No. 1, pp. 21-27, 1997.
B. A. Knyazev, et al., "Pulsed Plasma Sources for the Production of Intense Ion Beams Based on "Catalytic" Resonance Ionization," 18 pages, 1994.
B. L. Fontaine, et al., "Performance Characteristics of a Long Pulse and High Average Power XeCl Discharge Laser," SPIE vol. 801, High Power Lasers, pp. 100-105 (1987).
Sandia National Labs, "Particle Beam Fusion Progress Report, Jan.-Jun. 1980," published May 1981.
P. F. McKay, "Development of a Twelve-Plasma Gun, Single-Pulser Combination for Use in the PBFA-1 Hybrid Ion Diode," published Oct. 1985.
A. J. Cohen, "Anomalous Diffusion in a Plasma Formed from the Exhaust Beam of an Electron-Bombardment Ion Thruster," published Aug. 1968.
L. E. Weddle, "Ion Gun Generated Electromagnetic Interference on the Scatha Satellite," Dec. 1987.
S. Suckewer, "Spectral Measurements of Plasma Temperature in the Rod Plasma Injector (RPI)," Nukleonika, No. 1, 1970.
R. C. Olsen, et al., "Plasma Wave Observations During Ion Gun Experiments," Journal of Geophysical Research, vol. 95, No. A6, pp. 7759-7771, Jun. 1, 1990.
Y. Kiwamoto, "Small Barium Rail Gun for Plasma Injection," Rev. Sci. Instrum., vol. 51. No. 3, pp. 285-287, Mar. 1980.
S. Humphries, Jr., et al., "Pulsed Plasma guns for Intense Ion Beam Injectors," Rev. Sci. Instrum. vol. 52, No. 2, pp. 162-171, Feb. 1981.
H. Tamura, et al., "A Plasma Ion Gun with Pierce Electrode," Japan J. Appl. Phys. 5, pp. 985-987 (1966).
V. M. Chicherov, "Density Distribution of Hydrogen in the Interior of a Coaxial Plasma Injector Prior to the Application of High Voltage to its Electrodes," Journal of Technical Physics, vol. 36, No. 6, pp. 1055-1057, 1966.
L. M. Smith, et al., "Interferometric Investigation of a Cablegun Plasma Injector," IEEE Transactions on Plasma Science, vol. 28, No. 6, pp. 2272-2275, Dec. 2000.
A. Vizir, et al., "Recent Development and Applications of Electron, Ion and Plasma Sources Based on Vacuum Arc and Low Pressure Glow," IEEE Int. Conf. Plasma Sci., p. 286 (2004).
Kuiken, Gerard, "Thermodynamics of Irreversible Processes: Applications to Diffusion and Rheology", John Wiley & Sons, Oct. 1994.
Cobine, James Dillon, "Gaseous Conductors: Theory and Engineering Applications", Dover Publications, Inc. New York (1958).
U.S. Appl. No. 12/055,415, filed Mar. 26, 2008.
ALD Vacuum Technologies: Electron Beam Melting (EB), printed from http://web.ald-vt.de/cms/vakuum-technologie/anlagen/electron-beam-melting-eb, website accessed on Aug. 25, 2009, 4 pages.
Bakish, R., "The Substance of Technology: Electron Beam Melting and Refining", JOM, Nov. 1998, pp. 28-30.
Office Action dated Dec. 21, 2007 in U.S. Appl. No. 11/232,702.
Office Action dated Jul. 18, 2008 in U.S. Appl. No. 11/232,702.
Office Action dated Dec. 12, 2008 in U.S. Appl. No. 11/232,702.
Notice of Allowance dated Apr. 13, 2009 in U.S. Appl. No. 11/232,702.
Office Action dated Mar. 11, 2009 in U.S. Appl. No. 11/933,361.
Office Action dated Nov. 10, 2009 in U.S. Appl. No. 11/933,361.

Office Action dated Feb. 13, 2009 in U.S. Appl. No. 11/841,941.
Office Action dated Oct. 1, 2009 in U.S. Appl. No. 11/841,941.
Office Action dated Jun. 28, 2007 in U.S. Appl. No. 10/913,361.
Office Action dated Sep. 26, 2007 in U.S. Appl. No. 10/913,361.
Notice of Allowance dated Jan. 14, 2008 in U.S. Appl. No. 10/913,361.
Office Action dated Dec. 19, 2002 in U.S. Appl. No. 10/158,382.
Office Action dated Jun. 3, 2003 in U.S. Appl. No. 10/158,382.
Office Action dated Mar. 18, 2004 in U.S. Appl. No. 10/158,382.
Office Action dated Dec. 29, 2004 in U.S. Appl. No. 10/158,382.
Office Action dated Aug. 25, 2005 in U.S. Appl. No. 10/158,382.
Notice of Allowance dated May 2, 2006 in U.S. Appl. No. 10/158,382.
Supplemental Notice of Allowability dated Jun. 12, 2006 in U.S. Appl. No. 10/158,382.
Supplemental Notice of Allowability dated Jun. 29, 2006 in U.S. Appl. No. 10/158,382.
Office Action dated Nov. 20, 2002 in U.S. Appl. No. 09/882,248.
Office Action dated Jan. 21, 2003 in U.S. Appl. No. 09/882,248.
Office Action dated Jul. 8, 2003 in U.S. Appl. No. 09/882,248.
Notice of Allowance dated Oct. 22, 2003 in U.S. Appl. No. 09/882,248.
Office Action dated Dec. 6, 2001 in U.S. Appl. No. 09/726,720.
Notice of Allowance dated Apr. 23, 2002 in U.S. Appl. No. 09/726,720.
Office Action dated Aug. 29, 2005 in U.S. Appl. No. 11/008,048.
Office Action dated Nov. 8, 2005 in U.S. Appl. No. 11/008,048.
Response to Rule 312 Communication dated Aug. 16, 2006 in U.S. Appl. No. 11/008,048.
Notice of Allowance dated Jun. 27, 2006 in U.S. Appl. No. 11/008,048.
Office Action dated Dec. 9, 2009 in U.S. Appl. No. 12/053,245.
Hasse, Rolf, "Thermodynamics of Irreversible Processes", Dover Publications, Inc., New York, 1990, 5 pages.
Office Action dated Apr. 27, 2010 in U.S. Appl. No. 11/564,021.
Notice of Allowance dated Jun. 2, 2010 in U.S. Appl. No. 11/949,808.
Tien et al., "Superalloys, Supercomposites and Superceramics", Academic Press, Inc., Dec. 1989, pp. 49, 76-84.
Ausmus, S.L. and R.A. Beall, "Electroslag Melting of Titanium Slabs", Trans. Internat., Vacuum Metallurgy Conf., Dec. 1967, pp. 675-694.
Chronister et al., "Induction Skull Melting of Titanium and Other Reactive Alloys", Journal of Metals, Sep. 1986, pp. 51-54.

\* cited by examiner

METHOD AND APPARATUS FOR PRODUCING LARGE DIAMETER SUPERALLOY INGOTS

CROSS-REFERENCE TO RELATED APPLICATIONS

The present application is a continuation-in-part of, and claims priority under 35 U.S.C. §120 to, U.S. patent application Ser. No. 11/232,702, filed Sep. 22, 2005, now U.S. Pat. No. 7,578,960. The present application also claims priority under 35 U.S.C. §119(e) to U.S. Provisional Patent Application Ser. No. 60/909,118, filed Mar. 30, 2007.

BACKGROUND OF THE TECHNOLOGY

1. Field of the Invention

The present disclosure relates to apparatus and methods for melting and atomizing metals and metallic (i.e., metal-containing) alloys (collectively referred to herein as "alloys") to produce atomized molten materials that can be spray formed to produce large diameter alloy ingots. The apparatus and methods employ equipment and techniques that utilize electrons to melt alloys and/or atomize the molten alloys for use in spray forming large diameter alloy ingots having controllable chemistry, microstructure, dimensions, and material properties. The apparatus and methods disclosed herein are particularly useful in nickel-base superalloy ingot production, where conventional triple melt techniques pose various challenges.

2. Description of the Background of the Technology

In certain critical applications, components must be manufactured from nickel-base superalloys in the form of large diameter ingots that lack significant segregation. Such ingots must be substantially free of positive and negative segregation, and should be completely free of the manifestation of positive segregation known as "freckles". Freckles are the most common manifestation of positive segregation and are dark etching regions enriched in solute elements. Freckles result from the flow of solute-rich interdendritic liquid in the mushy zone of the ingot during solidification. Freckles in Alloy 718, for example, are enriched in niobium compared to the matrix, have a high density of carbides, and usually contain Laves phase. "White spots" are the major type of negative segregation. These light etching regions, which are depleted in hardener solute elements, such as niobium, typically are classified into dendritic, discrete, and solidification white spots. While there can be some tolerance for dendritic and solidification white spots, discrete white spots are of major concern because they frequently are associated with a cluster of oxides and nitrides that can act as a crack initiator.

Ingots substantially lacking positive and negative segregation and that are also free of freckles are referred to herein as "premium quality" ingots. Premium quality nickel-base superalloy ingots are required in certain critical applications including, for example, rotating components in aeronautical or land-based power generation turbines and in other applications in which segregation-related metallurgical defects may result in catastrophic failure of the component. As used herein, an ingot "substantially lacks" positive and negative segregation when such types of segregation are wholly absent or are present only to an extent that does not make the ingot unsuitable for use in critical applications, such as use for fabrication into rotating components for aeronautical and land-based turbine applications.

Nickel-base superalloys subject to significant positive and negative segregation during casting include, for example, Alloy 718 and Alloy 706. In order to minimize segregation when casting these alloys for use in critical applications, and also to better ensure that the cast alloy is free of deleterious non-metallic inclusions, the molten metallic material is appropriately refined before being finally cast. A conventional technique for refining Alloy 718 (UNS N07718), as well as certain other segregation-prone nickel-base superalloys such as Alloy 706 (UNS N09706) is the "triple melt" technique, which combines, sequentially, vacuum induction melting (VIM), electroslag remelting (ESR), and vacuum arc remelting (VAR). Premium quality ingots of these segregation-prone materials, however, are difficult to produce in large diameters by VAR melting, the last step in the triple melt sequence. In some cases, large diameter ingots are fabricated into single components, so areas of unacceptable segregation in VAR-cast ingots cannot be selectively removed prior to component fabrication. Consequently, the entire ingot or a portion of the ingot may need to be scrapped.

Ingots of Alloy 718, Alloy 706, and other nickel-base superalloys such as Alloy 600 (UNS N06600), Alloy 625 (UNS N06625), Alloy 720, and Waspaloy (UNS N07001), are increasingly required in larger weights, and correspondingly larger diameters for certain emerging applications. Such applications include, for example, rotating components for larger land-based and aeronautical turbines under development. Larger ingots are needed not only to achieve the final component weight economically, but also to facilitate sufficient thermomechanical working to adequately break down the ingot structure and achieve all final mechanical and structural requirements.

The melting of large diameter superalloy ingots accentuates a number of basic metallurgical and processing related issues. For example, heat extraction during melting becomes more difficult with increasing ingot diameter, resulting in longer solidification times and deeper molten pools. This increases the tendency towards positive and negative segregation. Also, larger ingots and electrodes can generate higher thermal stresses during heating and cooling. While ingots of the size contemplated by this invention have been successfully produced in several nickel-base alloys (for example, Alloys 600, 625, 706, and Waspaloy), Alloy 718 is particularly prone to these problems. To allow for the production of large diameter VAR ingots of acceptable metallurgical quality from Alloy 718 and certain other segregation-prone nickel-base superalloys, specialized melting and heat treatment sequences have been developed. One such specialized melting and heat treatment sequence is described in U.S. Pat. No. 6,416,564, entitled "Method for Producing Large Diameter Ingots of Nickel-Base Alloys," the entire disclosure of which is hereby incorporated by reference herein.

Accordingly, there is a need for an improved method of producing premium quality, large diameter nickel-base superalloy ingots. Spray forming is one method for producing large diameter superalloy ingots. During spray forming, a stream of molten metal is atomized to form a spray of fine molten-metal droplets or particles. The particles are then directed to a collector where they solidify into a coherent, near-fully-dense preform. In certain applications, controlled movement of the collector and atomizer, along with control of the molten metal transport process, allows high quality large preforms to be produced. The spray forming process is capable of producing fine-grained homogeneous microstructures with equiaxed grains and more than 98 percent theoretical density for a wide range of alloys. However, conventional spray forming generally employs fluid impingement atomization techniques, which present a number of drawbacks.

In conventional fluid impingement atomization techniques, either a gas or a liquid is impinged on a stream of a molten metallic material. Impingement using a liquid or certain gases introduces contaminants into the atomized material. Also, given that fluid impingement does not occur in a vacuum environment, even impingement techniques using inert gases can introduce significant levels of impurities into the atomized material. To address this, certain non-fluid impingement atomization techniques that may be conducted in a vacuum environment have been developed. These techniques include, for example, atomization techniques described in U.S. Pat. No. 6,772,961 B2, entitled "Methods and Apparatus for Spray Forming, Atomization and Heat Transfer" ("U.S. Pat. No. 6,722,961"), the entire disclosure of which is hereby incorporated by reference herein. U.S. Pat. No. 6,722,961 describes techniques wherein molten alloy droplets or a molten alloy stream produced by a melting device coupled with a controlled dispensing device are rapidly electrostatically charged by applying a high voltage to the droplets at a high rise rate. The electrostatic forces set up within the charged droplets cause the droplets to break up or atomize into smaller secondary particles. In one technique described in U.S. Pat. No. 6,722,961, primary molten droplets produced by the nozzle of a dispensing device are treated by an electric field from a ring-shaped electrode adjacent to and downstream of the nozzle. Electrostatic forces developed within the primary droplets exceed the surface tension forces of the particles and result in formation of smaller secondary particles. Additional ring-shaped field-generating electrodes may be provided downstream to treat the secondary particles in the same way, producing yet smaller molten particles.

Electron beam atomization is another non-fluid impingement technique for atomizing molten material, and is conducted in a vacuum. In general, the technique involves using an electron beam to inject a charge into a region of a molten alloy stream and/or a series of molten alloy droplets. Once the region or droplet accumulates sufficient charge exceeding the Rayleigh limit, the region or droplet becomes unstable and is disrupted into fine particles (i.e., atomizes). The electron beam atomization technique is described generally in U.S. patent application Ser. No. 11/232,702, entitled "Apparatus and Method for Clean, Rapidly Solidified Alloys", the entire disclosure of which is hereby incorporated by reference herein.

U.S. Pat. No. 6,722,961 also discloses techniques using electrostatic and/or electromagnetic fields to control the acceleration, speed, and/or direction of molten alloy particles formed by atomization in the process of producing spray formed preforms or powders. As described in U.S. Pat. No. 6,722,961, such techniques provide substantial downstream control of atomized material and can reduce overspray and other material wastage, improve quality, and enhance the density of solid preforms made by spray forming techniques.

Methods of collecting atomized materials as unitary preforms, such as, for example, spray forming and nucleated casting, are well known and have been described in numerous articles and patents. With respect to nucleated casting, specific reference is drawn to U.S. Pat. Nos. 5,381,847, 6,264,717, and 6,496,529 B1. In general, nucleated casting involves atomizing a molten alloy stream and then directing the resultant particles into a casting mold having a desired shape. The droplets coalesce and solidify as a unitary article shaped by the mold, and the casting may be further processed into a desired component. Spray forming involves directing atomized molten material onto a surface of, for example, a platen or a cylinder to form a free-standing preform. Characteristically, the typical solids fraction of the atomized particles significantly differs between spray forming and nucleated casting since, for example, a less fluid and mobile particle is used in the mold-less spray forming process.

In addition, aspects of the initial alloy melting process can present various disadvantages to the overall ingot production process. The alloy melting process involves preparing a charge of suitable materials and then melting the charge. The molten charge or "melt" may then be refined and/or treated to modify melt chemistry, remove undesirable components from the melt, and/or affect the microstructure of articles cast from the melt. Melting furnaces may be powered by means including electricity and the combustion of fossil fuels, and selection of a suitable apparatus is largely influenced by the relative costs and applicable environmental regulations, as well as by the identity of the material being prepared. A variety of melting techniques and apparatus are available today. General classes of melting techniques include, for example, induction melting (including vacuum induction melting), arc melting (including vacuum arc skull melting), crucible melting, and electron beam melting.

Electron beam melting typically involves utilizing thermoionic electron beam guns to generate high energy, substantially linear streams of electrons which are used to heat the target materials. Thermo-ionic electron beam guns operate by passing current to a filament, thereby heating the filament to high temperature and "boiling" electrons away from the filament. The electrons generated from the filament are then focused and accelerated toward the target in the form of a very narrow (nearly two-dimensional), substantially linear electron beam. A type of ion plasma electron beam gun also has been used for preparing alloy melts. Specifically, a "glow discharge" electron beam gun described in V.A. Chernov, "Powerful High-Voltage Glow Discharge Electron Gun and Power Unit on Its Base", 1994 Intern. Conf. on Electron Beam Melting (Reno, Nevada), pp. 259-267, has been incorporated in certain melting furnaces available from Antares, Kiev, Ukraine. Such devices operate by producing a cold plasma including cations which bombard a cathode and produce electrons that are focused to form a substantially two-dimensional, linear electron beam.

The substantially linear electron beams produced by the foregoing types of electron beam guns are directed into the evacuated melting chamber of an electron beam melting furnace and impinged on the materials to be melted and/or maintained in a molten state. The conduction of electrons through the electrically conductive materials quickly heats them to a temperature in excess of the particular melting temperature. Given the high energy of the substantially linear electron beams, which can be, for example, about 100 kW/cm$^2$, linear electron beam guns are very high temperature heat sources and are readily able to exceed the melting temperatures and, in some cases, the vaporization temperatures of the materials on which the substantially linear beams impinge. Using magnetic deflection or similar directional means, the substantially linear electron beams are rastered at high frequency across the target materials within the melting chamber, allowing the beam to be directed across a wide area and across targets having multiple and complex shapes.

Because electron beam melting is a surface heating method, it typically produces only a shallow molten pool, which can be advantageous in terms of limiting porosity and segregation in a subsequently formed ingot. Because the superheated metal pool produced by the electron beam is disposed within the high vacuum environment of the furnace melting chamber, the technique also tends to degas the molten material. Also, undesirable metallic and non-metallic constituents within the alloy having relatively high vapor pressures can be selectively evaporated in the melting chamber, thereby improving alloy purity. On the other hand, one must account for the evaporation of desirable constituents produced by the highly-focused, substantially two-dimensional linear electron beam. This is particularly the case with nickel-base superalloys, which contain various concentrations of elements such as aluminum, titanium, and chromium, for example, which may be volatilized and evaporated from the melt. This may have a substantial deleterious effect on the chemistry and material properties of a subsequently formed ingot. Undesirable evaporation must be factored into production and can significantly complicate alloy production when using electron beam melting furnaces.

The electron beam cold hearth melting technique is commonly used in the processing and recycling of reactive metals and alloys. The feedstock may be drip melted by impinging a substantially linear electron beam on an end of a feedstock bar. The melted feedstock drips into an end region of a water-cooled copper hearth, forming a protective skull. As the molten material collects in the hearth, it overflows and falls by gravity into a withdrawal mold or other casting device. During the molten material's dwell time within the hearth, substantially linear electron beams are quickly rastered across the surface of the material, retaining it in a molten form. This also has the effects of degassing and refining the molten material through evaporation of high vapor pressure components. The hearth also may be sized to promote gravity separation between high-density and low-density solid inclusions, in which case oxide and other relatively low-density inclusions remain in the molten metal for a time sufficient to allow dissolution, while high density particles sink to the bottom and become entrapped in the skull.

As noted above, many of the known processes for melting, atomizing and forming alloys to produce solid preforms are deficient in one or more respects. Such deficiencies include, for example, the existence of oxides and other contaminants in the final product, yield losses due to overspray, and inherent size limitations. These deficiencies are particularly problematic in the production of certain nickel-base superalloys. Accordingly, there is a need for improved methods and apparatus for melting, atomizing and forming large diameter ingots and other preforms from certain nickel-base superalloys, among other alloys.

SUMMARY

One general aspect of the present disclosure is directed to a novel method for producing large diameter alloy ingots. A material comprising at least one of a metal and a metallic alloy is introduced into a pressure-regulated chamber in a melting assembly. The material is subjected to a wide-area electron field within the pressure-regulated chamber to heat the material to a temperature above the melting temperature of the material and thereby form a molten alloy. At least one stream of molten alloy from the pressure-regulated chamber is provided from the melting assembly. The at least one stream of molten alloy is fed into an atomizing assembly in which particles of the molten alloy are generated by impinging electrons on the molten alloy to atomize the molten alloy and produce molten alloy particles. At least one of an electrostatic field and an electromagnetic field are generated to influence the particles of the molten alloy. The particles of the molten alloy are deposited onto a collector by a spray forming operation to form a large diameter alloy ingot.

Another general aspect of the present disclosure is directed to a novel apparatus for producing large diameter alloy ingots. The apparatus includes a melting assembly, an atomizing assembly in fluid communication with the melting assembly, a field generating assembly in fluid communication with the atomizing assembly, and a collector configured to receive particles of molten alloy to form a large diameter alloy ingot. The melting assembly includes a pressure-regulated chamber, with an optional hearth disposed in the pressure-regulated chamber. The melting assembly further includes at least one wire-discharge ion plasma electron emitter disposed in or adjacent the pressure-regulated chamber and positioned to direct a wide-area field of electrons into the chamber, wherein the wide-area field of electrons has sufficient energy to heat an alloy feedstock disposed within the chamber to its melting temperature. The atomizing assembly includes at least one electron emitter and is configured to direct electrons into at least one linear electron field and project the at least one linear electron field into a flow path of a molten alloy. The field generating assembly includes at least one field generating device configured to produce at least one of an electrostatic field and an electromagnetic field. The particles of a molten alloy are influenced by and directed to the collector by the at least one field.

The reader will appreciate the foregoing details, as well as others, upon considering the following detailed description of certain non-limiting embodiments of apparatus and methods according to the present disclosure. The reader also may comprehend such additional details upon carrying out or using the apparatus and methods described herein.

BRIEF DESCRIPTION OF THE DRAWINGS

The features and advantages of apparatus and methods described herein may be better understood by reference to the accompanying drawing in which.

DESCRIPTION OF VARIOUS NON-LIMITING EMBODIMENTS

Figure 1:
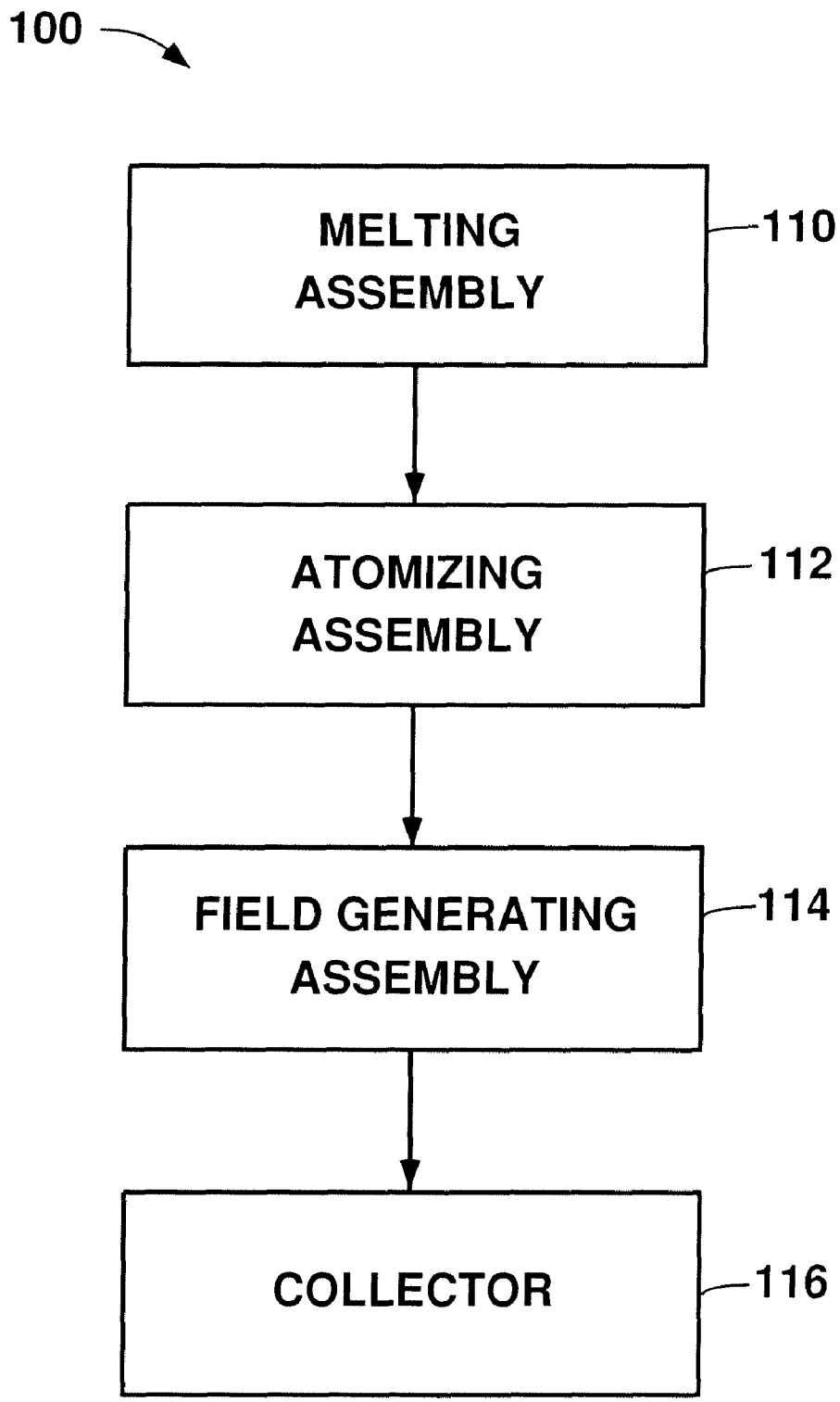
FIG. 1 is a schematic representation of one embodiment of an apparatus constructed according to the present disclosure.

While the specification concludes with claims which particularly point out and distinctly claim aspects of the present invention, it is believed that the present invention will be better understood from the following description of various non-limiting embodiments.

It is to be understood that certain descriptions of various embodiments have been simplified to illustrate only those elements and/or features that are relevant to a clear understanding of the present invention, while eliminating, for purposes of clarity, other elements and/or features. Those of ordinary skill in the art, upon considering the present description of various non-limiting embodiments according to the present disclosure, will recognize that other elements and/or features may be desirable in order to implement the present invention. However, because such other elements and/or features may be readily ascertained by one of ordinary skill upon considering the present description of certain embodiments of the invention, and are not necessary for a complete understanding of the present invention, a discussion of such elements and/or features is not provided herein. As such, it is to be understood that the description set forth herein is merely exemplary of a limited number of embodiments and is not intended to limit the scope of the claims.

In the present description of embodiments and in the claims, other than in the operating examples or where otherwise indicated, all numbers expressing quantities or characteristics of ingredients and products, processing conditions, and the like are to be understood as being modified in all instances by the term "about". Accordingly, unless indicated to the contrary, any numerical parameters set forth in the following description and the attached claims are approximations that may vary depending upon the desired properties one seeks to obtain in the alloys and articles according to the present disclosure. At the very least, and not as an attempt to limit the application of the doctrine of equivalents to the scope of the claims, each numerical parameter should at least be construed in light of the number of reported significant digits and by applying ordinary rounding techniques.

The articles "a," "an," and "the" are used herein to refer to one or more than one (i.e., to at least one) of the grammatical objects of the article. By way of example, "a component" means one or more components, and thus, possibly, more than one component is contemplated and may be employed or used.

Any patent, publication, or other disclosure material, in whole or in part, that is said to be incorporated by reference herein is incorporated herein only to the extent that the incorporated material does not conflict with existing definitions, statements, or other disclosure material set forth in this disclosure. As such, and to the extent necessary, the disclosure as set forth herein supersedes any conflicting material incorporated herein by reference. Any material, or portion thereof, that is said to be incorporated by reference herein, but which conflicts with existing definitions, statements, or other disclosure material set forth herein is only incorporated to the extent that no conflict arises between that incorporated material and the existing disclosure material.

The present disclosure, in part, is directed to an improved method and apparatus for producing large diameter nickel-base superalloy ingots. The methods and apparatus described herein include alloy melting technology utilizing wire-discharge ion plasma electron emitters, molten alloy atomization technology utilizing thermo-ionic electron beam emitters and/or wire discharge ion plasma electron emitters, and spray forming technology utilizing electrostatic and/or electromagnetic fields to direct molten atomized particles to a collector, where an ingot or other preform is formed.

In general, as illustrated in the schematic of FIG. 1, certain embodiments of an apparatus according to the present disclosure, referenced as 100 in FIG. 1, include: a melting assembly (also referred to herein as a "melting device") 110 that produces at least one stream of molten alloy, where the stream may be at least one of a continuous flow of molten alloy and a series of droplets of molten alloy; an electron beam atomizing assembly (also referred to herein as an "atomizing device") 112 that atomizes molten alloy from the melting assembly 110 and produces small molten alloy particles; a field generating assembly (also referred to herein as a "field generating device") 114 that generates at least one of an electrostatic and an electromagnetic field that influences at least one of the acceleration, speed, and direction of one or more of the molten alloy particles produced by the atomizing assembly 112; and a collector 116 that receives molten alloy particles. In certain embodiments, the melting assembly 110 comprises at least one wire-discharge ion plasma electron emitter. In certain embodiments, the atomizing assembly 112 comprises at least one wire-discharge ion plasma emitter and/or at least one thermo-ionic electron beam emitter. In certain embodiments, the field generating assembly 114 comprises electrostatic and/or electromagnetic field generating means, such as, for example, a coil or charged plates. In certain embodiments, the collector 116 comprises a rotating or stationary collector plate configured for the formation of an alloy ingot or other preform.

Also, in general, certain embodiments of a method according to the present disclosure comprise producing a stream of molten alloy and/or a series of droplets of molten alloy in a melting assembly that is substantially free from ceramic in regions of the melting assembly contacted by the molten alloy; generating molten alloy particles in an atomizing assembly by impinging electrons on molten alloy from the melting assembly; generating at least one of an electrostatic field and an electromagnetic field, wherein molten alloy particles from the atomizing assembly interact with the field, and the field influences at least one of the acceleration, speed, and direction of the molten alloy particles; and collecting the molten alloy particles in the form of an ingot or other preform.

As used herein, the terms "melting assembly" and "melting device" refer to a source of a continuous or intermittent stream and/or a series of droplets of a molten alloy, which may be produced from a charge of starting materials, scrap, an ingot, or another source of the alloy. The melting assembly or device is in fluid communication with and feeds molten alloy to an atomizing assembly or device. The melting assembly may substantially lack ceramic material in regions of the assembly that are contacted by the molten material. As used herein, the phrase "substantially lacks ceramic" and the like means that ceramic either is absent in regions of the referenced assembly or device that the molten material contacts during operation of the assembly or device, or is present in regions of the assembly or device that do contact the molten alloy during normal operation but in a way that does not result in the inclusion into the molten alloy of problematic amounts or sizes of ceramic particles or inclusions in the molten alloy.

It may be important to prevent or substantially limit contact between the molten material and ceramic material in the melting assembly because ceramic particles can "wash out" of the ceramic linings and mix with the molten alloy. The ceramic particles will have a higher melting point than the molten material and may be incorporated into the preform product. Once incorporated into the final product, the ceramic particles can fracture and initiate cracks in the product during low cycle fatigue. Once initiated, cracks can grow and result in product failure. Thus, depending on the intended application for the cast material, there may be little or essentially no allowance for the presence of ceramic particles in the material. This is particularly true for nickel-base superalloys, which are commonly employed in certain critical applications such as, for example, components of land-based and aeronautical turbine devices.

In conventional cast and wrought metallurgy, ceramic particles from the vacuum induction melting (VIM) step can be essentially removed during the subsequent vacuum arc remelting (VAR) step or, when using conventional triple-melt practice, during the electroslag remelting (ESR) plus VAR steps. Cleanliness achieved using various practices can be evaluated using a semi-quantitative test known as the "EB button" test, wherein a sample electrode of the material to be evaluated is electron beam melted in a crucible and the resulting floating raft of oxide is measured for the largest oxide present. In conventional powder metallurgy, the powder is consolidated into product after melting and there is no means of further refining the product to remove the oxides. Instead, the powder is sieved and the largest fraction of powder that is made into product is that which is equivalent to the smallest defect that the part designers use in their design criteria. In the design of the most critical turbine parts from consolidated powder metals, for example, the smallest modeled defect is approximately 44 microns and, thus, powders having a sieve size no larger than this are used. For less critical turbine parts, the smallest modeled defect could be as large as approximately 149 microns and, thus, powders having a sieve size no larger than this are used.

Melting techniques that are suitable for use in the methods and apparatus described herein include electron beam cold hearth melting techniques that incorporate wire-discharge ion plasma electron emitters. These techniques are described in U.S. Provisional Patent Application No. 60/909,118, entitled "Melting Furnace Including Wire-Discharge Ion Plasma Electron Emitter", the entire disclosure of which is hereby incorporated by reference herein.

Figure 2:
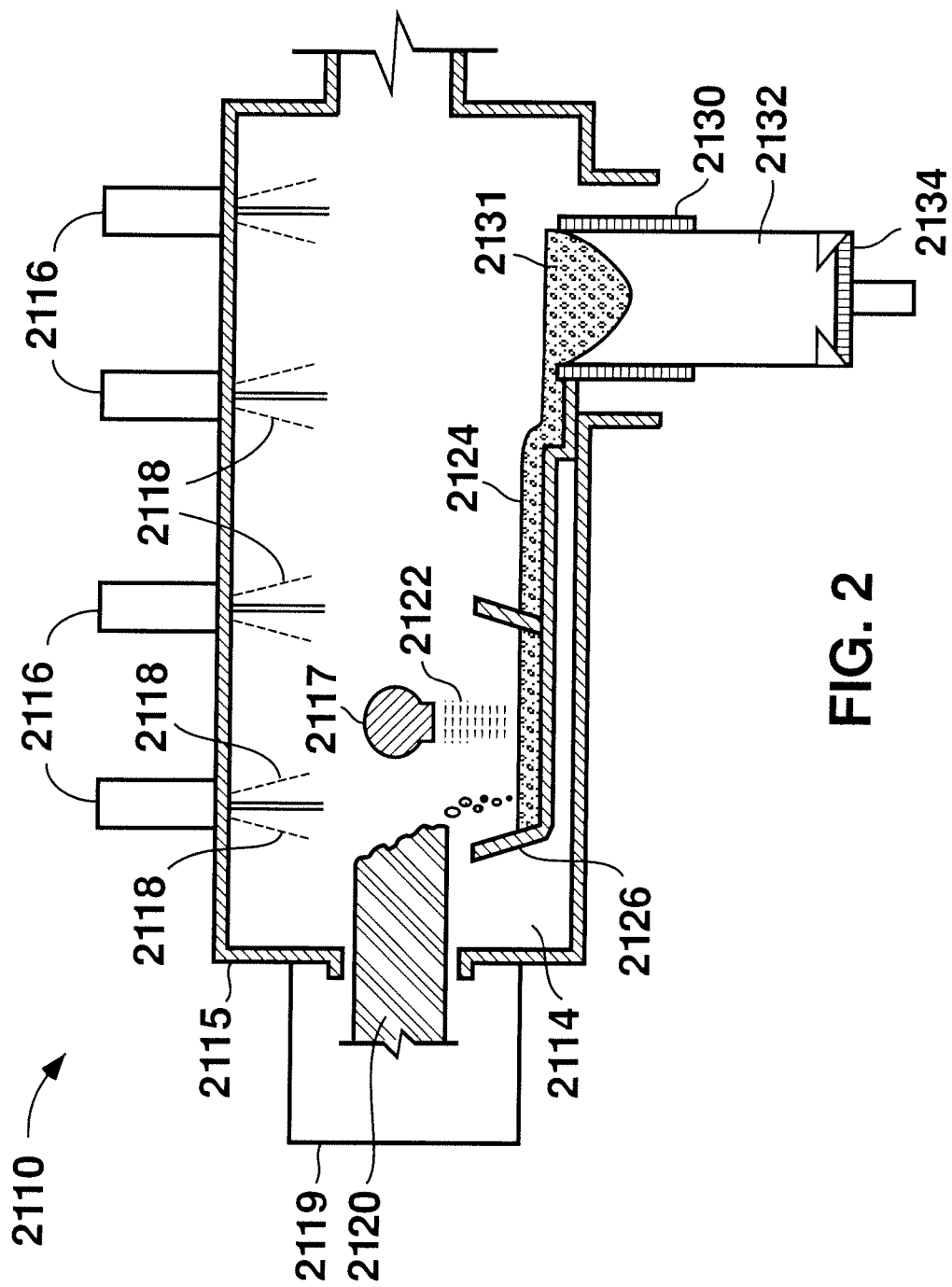
FIG. 2 is a schematic illustration in cross-section of an embodiment of a conventional thermo-ionic electron beam gun melting furnace.

A conventional thermo-ionic electron beam gun melting furnace is schematically illustrated in FIG. 2. Furnace 2110 includes melting chamber 2114 surrounded by chamber wall 2115. Multiple thermo-ionic electron beam guns 2116 are positioned outside and adjacent chamber 2114 and direct discrete substantially linear electron beams 2118 into chamber 2114. Feed material in the forms of metallic bar 2120 and alloying powder 2122 are introduced into chamber 2114 by a conventional bar feeder 2119 and a conventional particle or granule feeder 2117, respectively. The electron beam 2118 of one of the electron beam guns 2116 impinges on and melts an end of bar 2120, and the resulting molten alloy 2124 falls into water-cooled copper refining hearth 2126 (a "cold hearth") within chamber 2114. The thermo-ionic electron beam guns 2116 are of a conventional design and generate electrons by heating a suitable filament material such as, for example, tungsten. The guns 2116 focus the generated electrons to a point, and the electrons are projected from the guns 2116 in the form of a tightly focused, substantially linear beam. Thus, the electrons projected from the guns 2116 essentially impinge on the target as a point source. The heating of the target by the point source of electrons is facilitated by rastering the substantially linear electron beams 2118 across at least a portion of the targets, similar to the manner of rastering electrons across the phosphor screen of a cathode ray television tube. Rastering the electron beam 2118 of a thermo-ionic electron beam gun 2116 across the end region of bar 2120, for example, melts the bar 2120.

With further reference to FIG. 2, the molten alloy 2124 deposited in hearth 2126 is maintained in a molten state by rastering certain of the substantially linear electron beams 2118 across the surface of the molten alloy 2126 in a predetermined and programmed pattern. Powdered or granulated alloying material 2122 introduced into the molten alloy 2126 by feeder 2117 is incorporated into the molten material. Molten alloy 2124 advances across the hearth 2126 and drops from the hearth by gravity into a copper withdrawal mold 2130. Withdrawal mold 2130 includes a translatable base 2134 so as to accommodate the length of the growing ingot 2132. Molten alloy 2124 initially collects in withdrawal mold 2130 as molten pool 2131, and progressively solidifies into ingot 2132. Impingement of electrons onto molten pool 2131 by means of rastering one or more of the substantially linear electron beams 2118 across the pool's surface advantageously maintains regions of the pool 2131, particularly at the pool edges, in a molten state. The withdraw mold 2131 illustrated in FIG. 2 may be replaced with other alloy processing equipment such as, for example, an atomizing assembly, a field generating assembly, and a collector configured to form an ingot or other preform.

In furnaces utilizing one or more substantially linear electron beams to heat material in the furnace chamber, such as a conventional thermo-ionic electron beam gun melting furnace, alloys including volatile elements, i.e., elements with relatively high vapor pressure at the furnace melting temperatures, tend to boil off from the molten pool and condense on the relatively cold walls of the furnace chamber. (Common alloying elements having relatively high vapor pressures at temperatures commonly achieved by electron beam melting include, for example, aluminum, titanium and chromium.) The substantially linear electron beam melting technique is particularly conducive to volatilization, which is a significant disadvantage of conventional electron beam furnaces when alloying, as opposed to refining or purifying, for at least two reasons. First, the overall and localized chemical composition of the alloy becomes difficult to control during melting due to unavoidable losses of highly volatile elements from the molten pool. Second, the condensate of the vaporized elements tends to build up on the furnace walls over time and can drop back into the melt, thereby contaminating the melt with inclusions and producing localized variations in melt chemistry. These disadvantages are particularly acute in nickel-base superalloy applications, where highly controlled and defined chemistry and microstructure are critical.

Without intending to be bound by any particular theory, it is believed that the foregoing disadvantages of conventional electron beam melting furnaces result, in part, from the action of conventional substantially linear electron beams on the materials processed within electron beam furnaces. As suggested above in connection with the description of FIG. 2, conventional electron beam cold hearth melting technology utilizes substantially linear electron beams to both melt the raw materials introduced into the furnace and to maintain the temperature of the molten material as it flows along and over the cold hearth, and on to subsequent unit operations. Such furnaces typically include multiple electron beam sources, wherein each source produces a substantially linear electron beam that is essentially a point source. These "points" of intense electron concentration must be rastered rapidly over the areas to be heated so that the average temperature needed to melt the material and allow the molten material to adequately flow is reached throughout the target area. Because of the point source nature of the two-dimensional electron beams, however, the spot at which the electron beam impinges on the alloy is heated to an extremely high temperature. This phenomenon of localized intense heating can be observed as visible white radiation emitted from the particular spot at which the electron beam impinges on the solid or molten alloy within the furnace. It is believed that the intense superheating effect that occurs at these spots, along with the high vacuum maintained in the furnace chamber, readily evaporates the relatively volatile elements within the alloy, resulting in the excessive evaporation of the volatile elements and concomitant condensation on the chamber walls. As noted above, such condensation risks contamination of the bath as the condensed material drops back into the molten alloy, and this can result in, for example, marked compositional heterogeneities in the ingots or other preforms.

An improved design for an electron beam melting furnace described herein utilizes one or more wire-discharge ion plasma electron emitters as at least a part of the electron source in such a furnace. As used herein, the term "wire-discharge ion plasma electron emitter" refers to an apparatus that produces a relatively wide, three-dimensional field of electrons by impinging positively charged ions onto a cathode and thereby releasing electrons from the cathode. The electron beam produced by a wire-discharge ion plasma electron emitter is not a two-dimensional beam, but instead is a three-dimensional field or "flood" of electrons that, when impinged on the target, covers a two-dimensional surface region on the target that is very large relative to the small point covered by impinging a substantially linear electron beam onto the target. As such, the electron field produced by wire-discharge ion plasma electron emitters is referred to herein as a "wide-area" electron field, with reference to the relatively much smaller point of contact produced by conventional electron guns used in electron beam melting furnaces. Wire-discharge ion plasma electron emitters are known in the art and are variously referred to as, for example, "wire ion plasma (WIP) electron" guns or emitters", "WIP electron" guns or emitters and, somewhat confusingly, as "linear electron beam emitters" (referring to the linear nature of the plasma-producing wire electrode(s) within certain embodiments of the devices).

Figure 4:
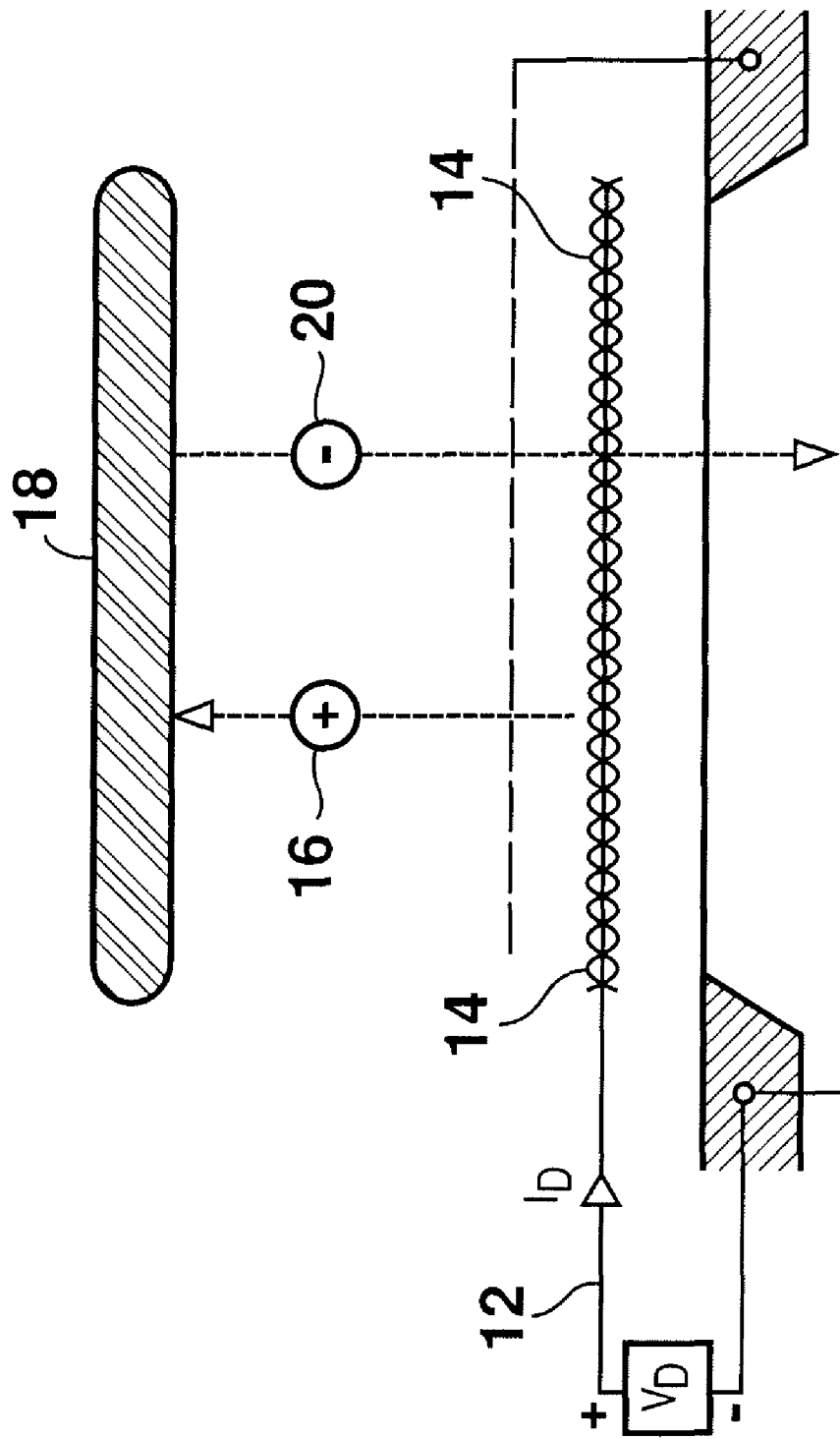
FIG. 4 is a simplified depiction of certain components of an embodiment of a wire-discharge ion plasma electron emitter.

Wire-discharge ion plasma electron emitters are available in a variety of designs, but all such emitters share certain fundamental design attributes. Each such emitter includes a plasma or ionization region including a positive ion source in the form of an elongate wire anode to produce plasma including cations, and a cathode that is spaced from and positioned to intercept positive ions generated by the wire. A large negative voltage is applied to the cathode, causing a fraction of the positive ions in the plasma generated by the wire positive ion source to be accelerated toward and to collide with the cathode surface such that secondary electrons are emitted from the cathode (the "primary" electrons being present within the plasma along with the positive ions). The secondary electrons produced from the cathode surface form an electron field that typically has the three-dimensional shape of the positive ion plasma impacting the cathode. The secondary electrons are then accelerated from the vicinity of the cathode back toward the anode, experiencing few collisions in the process of passing through the low-pressure gas within the emitter. By properly designing and arranging the various components of the wire-discharge ion plasma electron emitter, a wide field of energetic secondary electrons can be formed at the cathode and accelerated from the emitter and toward the target. FIG. 4 is a simplified depiction of components of a wire-discharge plasma ion electron emitter, wherein a current is applied to a thin wire anode 12 to generate plasma 14. Positive ions 16 within plasma 14 accelerate toward and collide with negatively-charged cathode 18, liberating wide-area secondary electron cloud 20, which is accelerated in the direction of anode 12 by action of the electric field between the electrodes and toward the target.

In various embodiments of the methods and apparatus described herein, a melting assembly for melting an electrically conductive metallic material includes a pressure-regulated chamber (melting chamber) and a hearth disposed in the melting chamber and configured to hold a molten material. At least one wire-discharge ion plasma electron emitter is disposed in or adjacent to the melting chamber and is positioned to direct a three-dimensional, wide-area field of electrons generated by the emitter into the chamber. The wire-discharge ion plasma electron emitter produces a three-dimensional field of electrons having sufficient energy to heat the electrically conductive metallic material to its melting temperature. An atomizing assembly is configured to receive material from the hearth. The melting assembly may be used to melt any material that may be melted using a conventional electron beam melting furnace, such as, for example, aluminum, boron, carbon, copper, manganese, molybdenum, niobium, tantalum, chromium, titanium, titanium alloys, tungsten, niobium, tantalum, platinum, palladium, zirconium, iridium, nickel, nickel-base alloys, iron, iron base alloys, cobalt, cobalt base alloys, and combinations thereof. In various embodiments, the melting assembly is configured to melt a charge comprising materials that make up the chemistry of cobalt-base superalloys or nickel-base superalloys. In various other embodiments, the melting assembly is configured to melt a preformed alloy ingot or other structure, which may have previously been produced and processed by one or more of VIM, VAR, and ESR, for example.

The melting assembly may include one or more material feeders adapted to introduce electrically conductive materials or other alloying additives into the melting chamber. Preferably, the feeders introduce the materials into the melting chamber in a position over or above at least a region of the hearth so that gravity will allow the materials, in solid or molten form, to fall downward and into the hearth. Feeder types may include, for example, bar feeders and wire feeders, and the feeder type selected will depend upon the particular design requirements for the furnace. In certain embodiments of the methods and apparatus described herein, the material feeder and at least one of the one or more wire-discharge ion plasma electron emitters of the melting assembly are disposed so that the electron field emitted by the wire-discharge ion plasma electron emitter at least partially impinges on the material introduced into the chamber by the feeder. If the material that is introduced into the melting chamber by the feeder is electrically conductive, then the electron field, if of sufficient strength, will heat and melt the material.

The hearth incorporated in the melting assembly may be selected from the various hearth types known in the art. For example, the melting assembly may be in the nature of an electron beam cold hearth melting furnace by incorporating a cold hearth or, more specifically, for example, a water-cooled copper cold hearth in the melting chamber. As is known to those of ordinary skill, a cold hearth includes cooling means causing molten material within the hearth to freeze to the hearth surface and form a protective layer thereon. As another example, the hearth may be an "autogenous" hearth, which is a hearth that is plated with or fabricated from the alloy that is being melted in the furnace, in which case the bottom surface of the hearth also may be water-cooled to prevent burn-through.

The particular hearth included in the melting chamber may include a molten material holding region, in which the molten material resides for a certain dwell time before passing to the atomizing device fluidly connected to the melting chamber. In certain embodiments of a melting assembly according to the present disclosure, the hearth and at least one of the one or more wire-discharge ion plasma electron emitters are disposed in the melting assembly so that the electron field emitted by the wire-discharge ion plasma electron emitter at least partially impinges on the molten material holding region. In this way, the electron field may be applied to maintain the material within the molten material holding region in a molten state.

One non-limiting embodiment of a melting assembly according to the present disclosure includes a pressure-regulated melting chamber and a hearth disposed in the pressure-regulated melting chamber, wherein the hearth includes a molten material holding region. The melting assembly further includes one or more wire-discharge ion plasma electron emitters disposed in or adjacent the pressure-regulated melting chamber. The hearth and the at least one wire-discharge ion plasma electron emitter are disposed so that an electron field produced by the emitter at least partially impinges on the molten material holding region. An atomizing assembly fluidly communicates with the pressure-regulated melting chamber and is positioned to receive molten material from the hearth. A least one feeder is included in the furnace and is adapted to introduce material into the pressure-regulated melting chamber in a position over at least a region of the hearth.

Any suitable wire-discharge ion plasma electron emitter may be used in connection with apparatus according to the present disclosure. Suitable embodiments of wire-discharge ion plasma electron emitters are disclosed in, for example, U.S. Pat. Nos. 4,025,818; 4,642,522; 4,694,222; 4,755,722; and 4,786,844, the entire disclosures of which are hereby incorporated by reference herein. Suitable emitters include those capable of producing a three-dimensional, wide-area electron field that may be directed into the melting chamber of the furnace and that will heat electrically conductive feed materials placed into the melting chamber to the desired temperature.

In one embodiment of a wire-discharge ion plasma electron emitter, the emitter includes a plasma region and a cathode region. The plasma region includes at least one elongate wire anode adapted to produce a plasma including positive ions. The cathode region includes a cathode which is electrically connected to a high voltage power supply adapted to negatively charge the cathode. In the wire-discharge ion plasma electron emitter, the electrode used to produce the plasma may be one wire or multiple wires positioned along a length of the plasma region. At least a portion of the cathode impacted by the positive ions is composed of a material suitable for generating electrons. Certain non-limiting embodiments of the cathode disposed in the cathode region of the emitter also may include an insert, such as, for example, a molybdenum insert, having a high melting temperature and a low work function so as to facilitate generation of electrons. The cathode and the anode are positioned relative to one another so that the positive ions in the plasma generated by the wire anode accelerate toward and impinge on the cathode under influence of the electric field between the electrodes, liberating the wide-area field of secondary electrons from the cathode.

Certain non-limiting embodiments of the wire-discharge ion plasma electron emitter include at least one suitably electron transmissive window, such as a thin electron transmissive titanium or aluminum foil, that opens through a wall of the melting chamber. Suitable electron transmissive windows may also include, for example, windows comprising boron nitride or carbon (e.g. diamond) materials. Electron transmissive windows may further comprise materials including low atomic number elements generally known in the art to be transmissive to electrons.

As discussed herein, other embodiments of the wire-discharge ion plasma electron emitter do not include an electron transmissive window, in which case the plasma region of the emitter fluidly communicates with the melting chamber holding the molten alloy. In either case, the wide-area electron field derived enters the melting chamber and may be impinged on the material within the chamber. If an electron transmissive window does separate the interior of the electron emitter from the melting chamber (as discussed further herein), then the electron field passes through the window as it is projected from the electron emitter into the melting chamber. In certain non-liming embodiments of a wire-discharge ion plasma electron emitter, the high voltage power supply electrically coupled to the cathode powers the cathode to a negative voltage greater than 20,000 volts. The negative voltage serves the functions of accelerating the positive ions in the plasma toward the cathode, and also repelling the secondary electron field from the cathode and toward the anode.

An electron transmissive window is necessary if the pressure within the wire-discharge ion plasma electron emitter differs significantly from the pressure within the melting chamber, in which case the foil window serves to isolate the two adjacent regions of differing pressure. An advantage of wire-discharge ion plasma electron emitters relative to non-gas containing electron emitters, such as thermo-ionic electron beam guns, is that wire-discharge ion plasma electron emitters must include gas within the plasma region to serve as the plasma source. Although wire-discharge ion plasma electron emitters can operate at very low gas pressures, such devices also can operate effectively at relatively high gas pressures.

In contrast, conventional electron beam melting furnaces commonly operate at ultra-low vacuum conditions, and in that case an electron transmissive window would be necessary to separate the gas atmosphere within the wire-discharge ion plasma electron emitter and the near vacuum environment within the melting chamber. It appears, however, that volatile element evaporation within the melting chamber may be reduced by increasing the gas pressure within the melting chamber beyond the ultra-low levels of conventional two-dimensional (thermo-ionic emitter) electron beam melting furnaces. Those conventional pressures levels are typically within the range of $10^{-3}$ to 7.5 µm Hg ($10^{-3}$ to 1 Pa) and do not exceed 15 µm Hg (2 Pa). Increasing pressure within the furnace chamber beyond conventional levels, i.e., to pressures exceeding 15 µm Hg (2 Pa), preferably exceeding 40 µm Hg (5.3 Pa), or more preferably exceeding 300 µm Hg (40 Pa), increases the pressure at the surface of the molten material within the furnace and thereby reduces the driving force for undesirable vaporization. For example, data presented in H. Duval et al., "Theoretical and Experimental Approach of the Volatilization in Vacuum Metallurgy", suggests that there is a significant reduction in chromium vapor transport at 66.7 Pa (500 mtorr) argon relative to 4.27 Pa (35 mTorr) argon.

Because wire-discharge plasma ion electron emitters already require a partial gas pressure environment (typically of helium) to be operational, it is possible that both the wire-discharge plasma ion electron emitter and the melting chamber could be operated at substantially the same pressure, wherein the pressure is sufficiently high to allow the electron emitter to operate and also is higher than in conventional electron beam furnaces, thereby reducing undesirable volatilization within the melting chamber. In such cases, the electron transmissive window may be omitted such that the gas environment within the emitter and within the melting chamber is substantially the same. Alternatively, in another embodiment of a wire-discharge ion plasma electron emitter the electrons generated by the emitter pass through a gas-impermeable window that is transparent to electrons, wherein the pressure of ionizable gas within the emitter is suitable for electron emitter operation and the melting chamber is operated at a pressure greater than conventional pressures in electron beam furnaces and is suitable for minimizing or reducing undesirable volatilization. It will be understood that the reduction in undesirable elemental vaporization would be optimized by both utilizing one or more wire-discharge ion plasma electron emitters, which do not create points of intense heating, along with melting chamber pressures greater than are conventional in electron beam furnaces.

Further discussion of possible embodiments of an electron beam melting apparatus and possible embodiments of a wire-discharge ion plasma electron emitter useful in connection with an apparatus according to the present disclosure are provided below.

Figure 3:
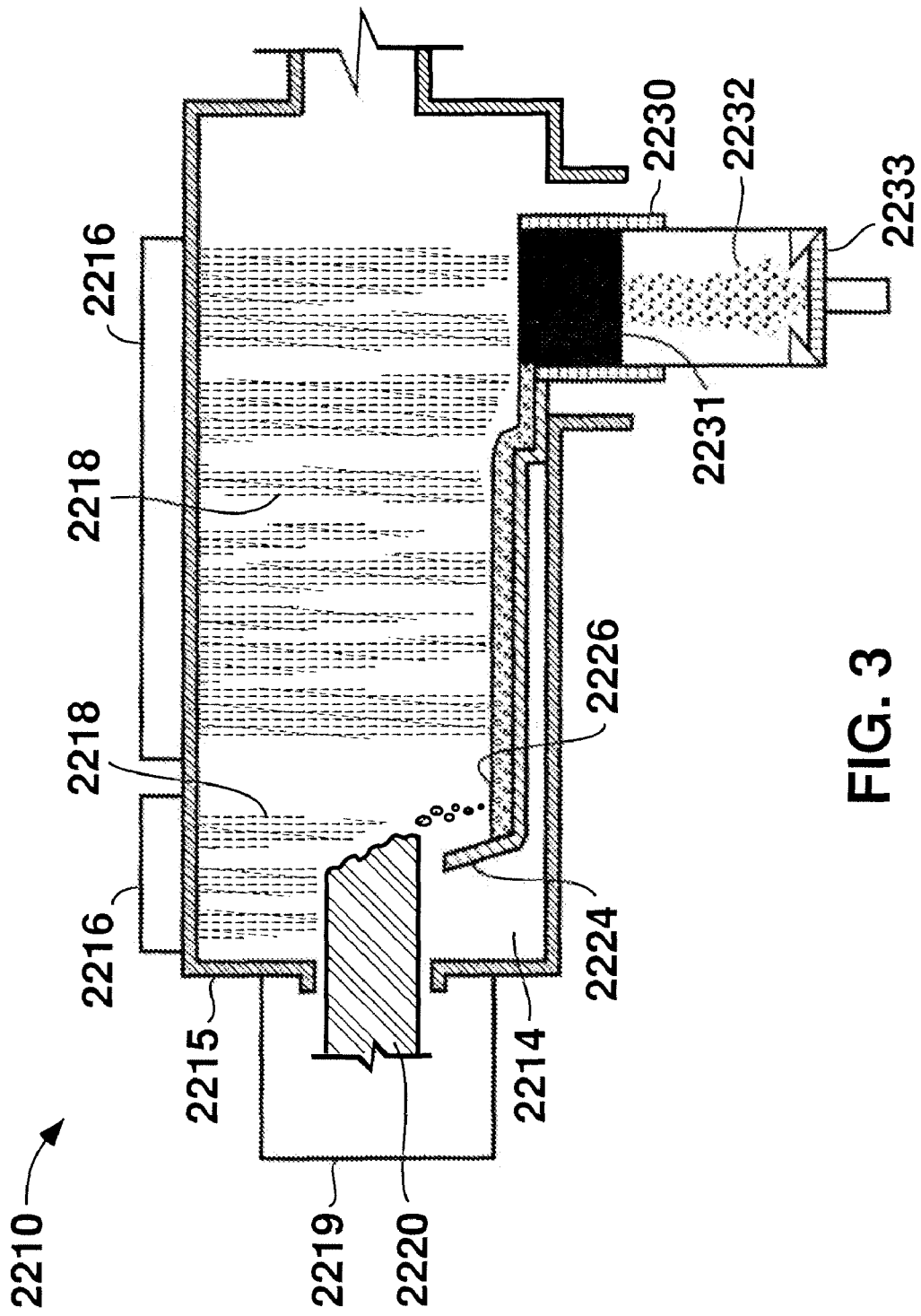
FIG. 3 is a schematic illustration in cross-section of one non-limiting embodiment of an electron beam cold hearth melting assembly including multiple wire-discharge ion plasma electron emitters according to the present disclosure.

FIG. 3 schematically illustrates one possible non-limiting embodiment of an improved electron beam melting assembly according to the present disclosure. Melting assembly 2210 includes melting chamber 2214 at least partially defined by chamber wall 2215. Wire-discharge ion plasma electron emitters 2216 are positioned outside and adjacent chamber 2214. The wire-discharge ion plasma electron emitters 2216 project wide-area electron fields 2218 into the interior of the chamber 2214. Similar to the conventional furnace 2110 shown in FIG. 2, alloy bar 2220 is introduced into chamber 2214 by a bar feeder 2219. Molten alloy 2226 is produced by impinging the wide-area electron field 2218 of at least one wire-discharge ion plasma electron emitter 2216 onto bar 2220. The molten alloy 2226 melted from bar 2220 drops into water-cooled copper hearth 2224 and is resident in the hearth 2224 for a certain dwell time, where it is heated, degassed, and refined by one or more of the wide-area electron fields 2218 produced by emitters 2216. The molten alloy 2226 ultimately drops from hearth 2224 into atomizing assembly 2231 where the molten alloy is atomized to particles 2232, which are influenced by field generating assembly 2230 and directed to deposit onto collector 2233.

As discussed above, the wire-discharge ion plasma electron emitters 2216 of melting assembly 2210 are designed to generate a field or "flood" of energetic electrons covering a wide area relative to the spot coverage of the substantially linear beam produced by electron beam guns used in conventional electron beam furnaces. The electron field emitters 2216 spread electrons over a wide area and impinge on the materials to be melted and/or maintained in the molten state within the melting assembly 2210. Because the electron field it produces will cover a wide area within the melting chamber, a wire-discharge ion plasma electron emitter will maintain a more even temperature within the electron beam melting assembly relative to a conventional electron beam furnace, and also dispenses with the need to raster a highly focused spot of electrons.

Nevertheless, certain embodiments of the electron beam assembly according to the present disclosure may include components generating electric fields or other suitable components to steer the field of electrons generated by the one or more wire-discharge ion plasma electron emitters as desired. For example, in melting assembly 2210 it may be desirable to raster the broad field produced by a wire-discharge ion plasma electron emitter 2216 from side-to-side to provide additional heat to edges of the hearth 2224. By flooding a relatively wide area with a field of energetic electrons, rather than rastering a point source of electrons across the area, the localized intense heating effect (e.g., power per unit area) associated with substantially linear electron beams that occurs when using conventional electron beam melting furnaces is significantly reduced. This eliminates or at least significantly reduces the extent to which relatively volatile alloying elements undesirably evaporate for the reason that points of relatively extremely high temperature are not produced. This, in turn, partially or wholly obviates the compositional control and contamination problems inherent in the conventional linear electron beam furnace design.

Figure 5:
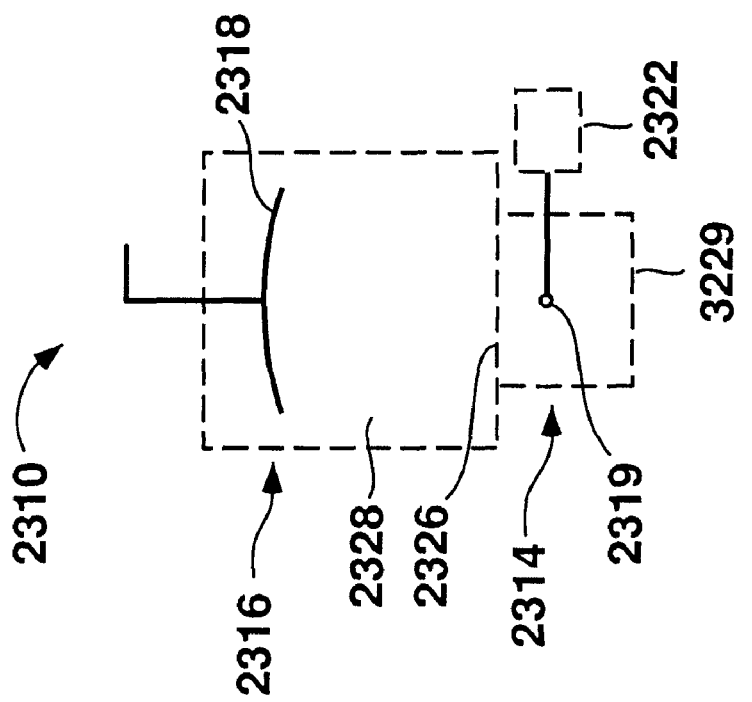
FIG. 5 is a schematic illustration of one non-limiting embodiment of a wire-discharge ion plasma electron emitter.

As noted above, various embodiments of wire-discharge ion plasma electron emitters generally include one or more elongate wire anodes producing positive ion plasma, wherein the plasma is impinged upon a cathode to generate a field of secondary electrons that may be accelerated to impinge on a target to be heated. A schematic representation of one design of a wire-discharge ion plasma electron emitter is shown in FIG. 5. This emitter 2310 includes an ionization or plasma region 2314 in which a positive ion plasma is produced, and a cathode region 2316 that includes cathode 2318. The plasma region 2314 is filled with an ionizable gas at low pressure, and the gas is ionized in the plasma region to produce a cation-containing plasma. For example, the ionization region 2314 may be filled with helium gas at, for example, approximately 20 mtorr. A small diameter elongate wire anode 2319 passes through a length of the plasma chamber 2314. A positive voltage is applied to wire anode 2319 by power supply 2322, and this initiates ionization of the helium gas into a plasma comprising helium cations and free electrons (the "primary" electrons). Once ionization of the helium gas is initiated, the plasma is sustained by applying a voltage to the thin wire anode 2319. Positively charged helium ions within the plasma are extracted from the ionization chamber 2314 through an extraction grid 2326 maintained at a high negative electrical potential and accelerated through a high voltage gap into the cathode region 2316, where the cations in the plasma impact high negative voltage cathode 2318. Cathode 2318 may be, for example, a coated or uncoated metal or alloy. Impingement of helium ions on cathode 2318 releases secondary electrons from cathode 2318. The high voltage gap 2328 accelerates the secondary electrons in a direction opposite the direction of movement of the helium cations, through the extraction grid 2326 and into the plasma region chamber 2314, and then through a thin metallic foil window 2329 made of material relatively transparent to electrons. As noted above, depending on the relative gas pressures within the electron emitter and the melting chamber, it may be possible to omit the foil window 2329, in which case the electrons produced by the emitter would enter the melting chamber directly.

The wire electrode 2319 and the cathode 2318 may be designed and arranged to better promote movement of the positively charged helium ions to the cathode 2318. Also, the cathode 2318 and the extraction grid 2326 may be designed and arranged to maximize secondary electron transmission through the grid 2326 and with a beam profile suitable for penetration through foil window 2329, if present. The wide-area field of energetic electrons exiting the emitter 2310 may be directed to impinge on a target positioned opposite foil window 2329 and within the melting chamber of a melting furnace. Also, the window 2329 may be sized to be as thin as possible in order to maximize electron transmission from emitter 2310. An aluminum-type or titanium-type foil having a thickness allowing sufficient electron transmission, while also maintaining a soft vacuum environment within the emitter 2310, may be used as foil window 2329, if necessary. Other suitably strong and acceptably electron transparent materials that may be used as a window in the apparatus, if present, will be known to those having ordinary skill. As discussed generally herein, window 2329 may be omitted if the pressure differences between the interior of the emitter 2310 and the melting chamber continuing the target are not significant.

Figure 6:
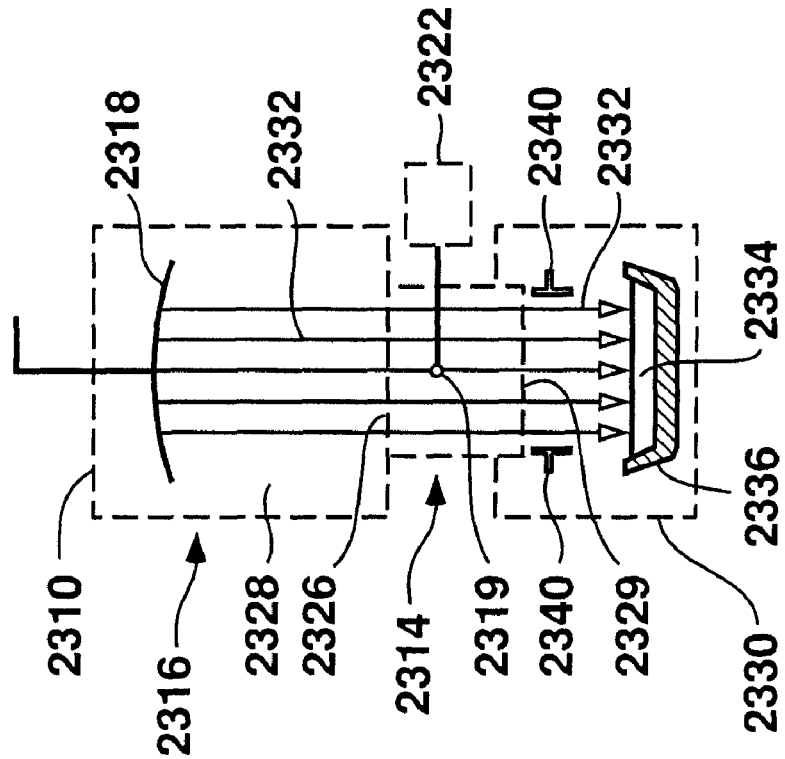
FIG. 6 is a schematic illustration of one non-limiting embodiment according to the present disclosure of an electron beam melting apparatus including a wire-discharge ion plasma electron emitter as an electron source.

According to the present disclosure, one or more wire-discharge ion plasma electron emitters, such, for example, emitter 2310, may be provided to supply the energetic electrons into the melting chamber of an electron beam melting furnace, as a substitute for electron beam guns producing a substantially linear electron beam. As shown in FIG. 6, one non-limiting embodiment of an electron beam melting apparatus according to the present disclosure includes one or more wire-discharge ion plasma electron emitters 2310 positioned adjacent melting chamber 2330. Wide-area electron field 2332 exits emitter 2310 through film window 2329 and floods at least a region of the surface of the molten alloy 2334 in hearth 2336, thereby heating the alloy to maintain it in a molten state. Because the electrons impinging on the alloy in hearth 2336 are spread across a relatively wide area, the energy focused on the molten material in any particular localized region is not great enough to result in a problematic level of volatilization of elements from the alloy, thereby reducing or obviating the alloy contamination and heterogeneity problems inherent in the use of conventional electron beam melting furnaces. As noted above, film window 2329 may be omitted if the operating pressure differential between the emitter 2310 and the melting chamber 2330 is not significant. Also, as noted above, the melting chamber 2330 preferably is operated at a pressure higher than is conventional in order to further reduce or eliminate undesirable elemental vaporization, and in such case the need for a film window partitioning the electron emitter from the melting chamber will, again, depend on the particular pressure differential inherent in the design. Optionally, components 2340 for electrostatically or magnetically steering the wide-area electron field are provided so as to allow further improved control of the melting process within the melting chamber 2330.

Although FIG. 6 provides a simplified view of one embodiment of a wire-discharge ion plasma electron melting furnace according to the present disclosure including a single electron emitter, it will be apparent to those of ordinary skill that actual or alternate embodiments of such an apparatus may have multiple wire-discharge ion plasma electron emitters. It also will be apparent that one or more wire-discharge ion plasma electron emitters may be incorporated in such an apparatus to: (1) melt raw materials introduced into the melting chamber, in the form of, for example, an alloy ingot, slab, bar, wire, or other charge; and (2) maintain molten alloy resident in the furnace hearth at a temperature above the alloy melting temperature (and possibly degas and/or refine the molten alloy). Also, in various embodiments, one or more wire-discharge ion plasma electron emitters may be used along with one or more electron beam guns producing conventional substantially two-dimensional, linear electron beams.

Figure 7:
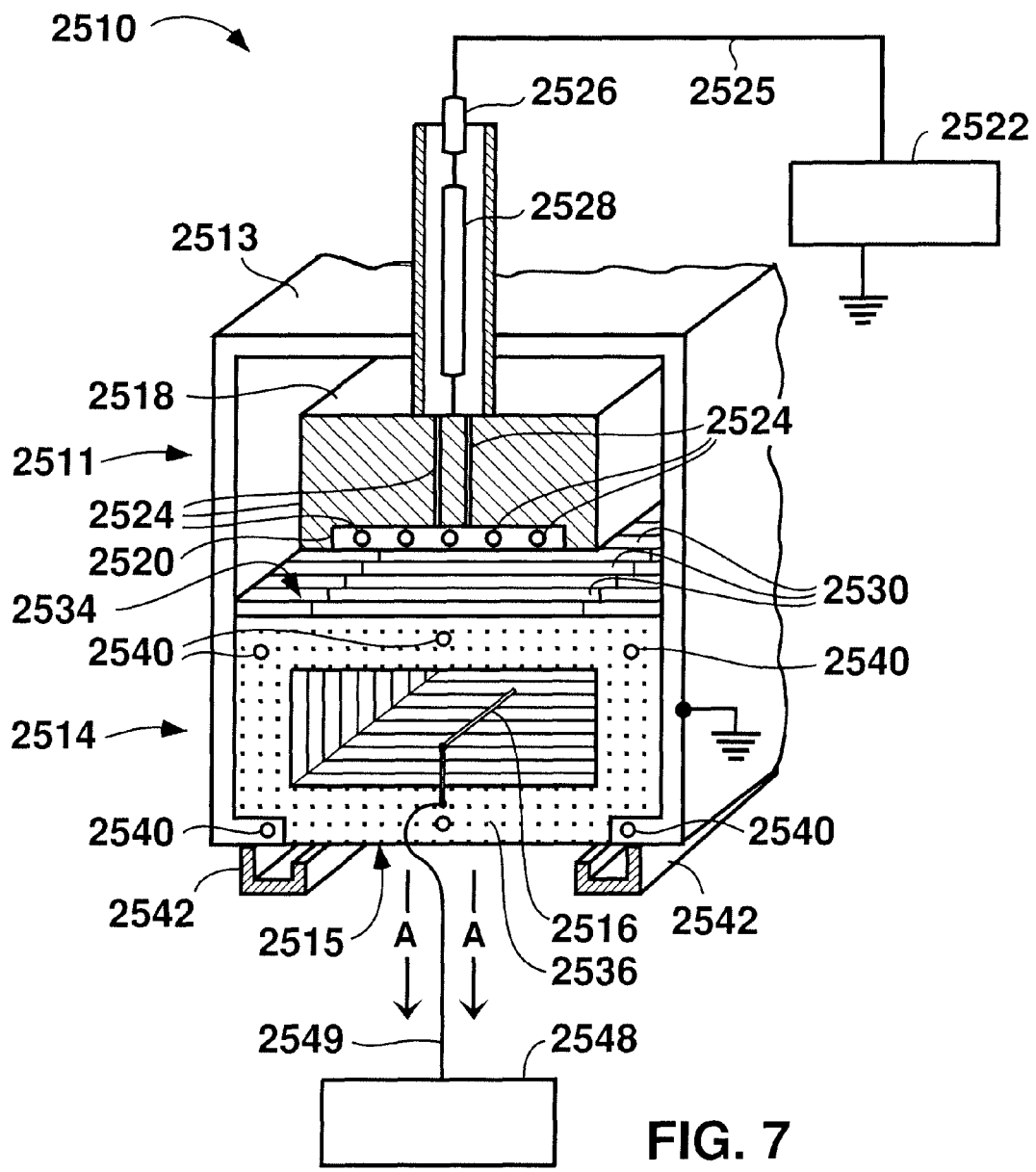
FIG. 7 is a perspective view, partly in section, of one non-limiting embodiment of a wire-discharge ion plasma electron emitter that may be adapted for use in an electron beam melting apparatus according to the present disclosure.
Figure 8:
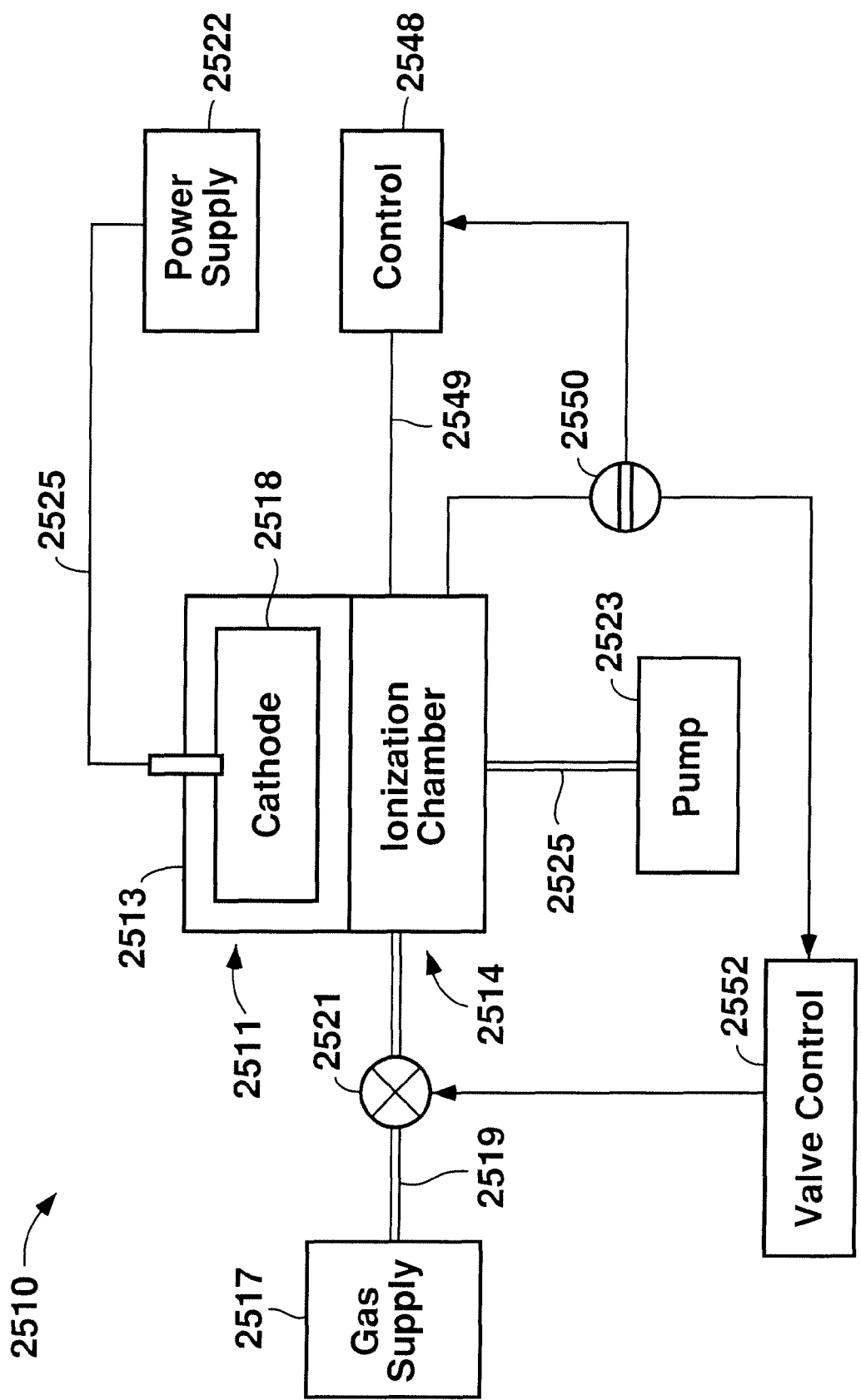
FIG. 8 is a diagram illustrating operation of the wire-discharge ion plasma electron emitter illustrated in FIG. 7.

FIGS. 7 and 8 provide additional details related to one possible non-limiting embodiment of a wire-discharge ion plasma electron emitter that may be adapted for use as the source of energetic electrons in an embodiment of an electron beam melting apparatus according to the present disclosure. FIG. 7 is a perspective view, partly in section, of a wire-discharge ion plasma electron emitter embodiment. FIG. 8 is a schematic diagram illustrating, in a simplified way, the operation of emitter 2510. Emitter 2510 includes electrically grounded enclosure 2513, which includes cathode region 2511, ionization or plasma region 2514, and electron transmissive foil window 2515. Elongate wire electrode 2516 extends through a length of ionization region 2514. Foil window 2515 is electrically coupled to chamber 2513 and thereby forms an anode that operates to accelerate electrons within chamber 2513 therethrough to exit chamber 2513 in the general direction of arrows "A". Chamber 2513 is filled with helium gas at low pressure, such as $1^{-10}$ mTorr, and is supplied with the gas by gas supply 2517. Gas supply 2517 is connected to enclosure 2513 by conduit 2519, which passes through valve 2521. Pressure regulation in chamber 2513 by pump 2523, which is connected to chamber 2513 by conduit 2524.

Cathode region 2511 includes cathode 2518, which in turn includes insert 2520 mounted on a lower surface thereof. The insert 2520 may be composed of, for example, molybdenum, but may be composed of any material with a suitably high secondary electron emission coefficient. Cathode 2518 is suitably uniformly spaced from the walls of enclosure 2513 to prevent Paschen breakdown. Cathode 2518 is coupled to high voltage power supply 2522 by cable 2524, which passes through insulator 2526 and into resistor 2528. Power supply 2522 supplies high negative potential, for example, 200-300 kV, to cathode 2518. Cathode 2518 and insert 2520 may be suitably cooled, such as by, for example, circulating oil or another suitable cooling fluid through conduits 2524.

Ionization region 2514 includes a plurality of thin metallic ribs which are coupled both electrically and mechanically. Each rib 2530 includes a central cut-out region to allow wire electrode 2516 to pass through the ionization chamber 2514. The sides of ribs 2530 facing cathode 2518 form an extraction grid 2534. The opposed side of all or a portion of the ribs 2530 provide a support grid 2536 for electron transmissive foil window 2515. Cooling channels 2540 may be provided to circulate a cooling fluid through and in the vicinity of ribs 2530 to allow for heat removal from ionization region 2514. Electron transmissive foil window 2515, which may be composed of, for example, aluminum or titanium foil, is supported on grid 2515 and is sealed to enclosure 2513 by an O-ring or other structures sufficient to maintain the high vacuum helium gas environment within enclosure 2513. In certain embodiments of emitter 2510, a gas manifold 2544 is provided to cool foil window 2515, such as with pressurized nitrogen. As discussed generally herein, window 2515 may be omitted if the pressure differences between the interior of the chamber 2513 of emitter 2510 and the chamber containing the target of the electron field are not significant.

An electrical control device 2548 is connected to wire electrode 2516 through connector 2549. On activation of control device 2548, wire electrode 2516 is energized to a high positive potential, and helium within ionization region 2514 is ionized to produce plasma including helium cations. Once the plasma is initiated in ionization region 2514, cathode 2518 is energized by power supply 2522. Helium cations in the ionization region 2514 are electrically attracted to cathode 2518 by the electric field that extends from the cathode 2518 into the plasma region 2514. The helium cations travel along the field lines, through the extraction grid 2534, and into the cathode region 2511. In the cathode region 2511, the helium cations accelerate across the full potential of the electric field generated by the energized cathode 2518 and forcefully impinge on the cathode 2518 as a collimated beam of cations. The impacting cations free secondary electrons from the insert 2520. The secondary electron field produced by the insert 2520 is accelerated in a direction opposite the direction of travel of the helium cations, toward the wire electrode 2516, and through foil window 2515, if present.

Means may be provided to monitor the actual gas pressure within the chamber 2513 as changes in pressure may affect the density of the helium ion plasma and, in turn, the density of the secondary electron field generated at the cathode 2518. An initial pressure may be set within enclosure 2513 by appropriately adjusting valve 2521. Once the cation-containing plasma is initiated in plasma region 2514, a voltage monitor 2550 may be provided to indirectly monitor the instantaneous quiescent pressure within the chamber 2513. A rise in voltage is indicative of a lower chamber pressure. The output signal of the voltage monitor 2550 is used to control valve 2521, through valve controller 2552. The current supplied to wire electrode 516 by control device 2548 also is controlled by the signal of voltage monitor 2550. Utilizing the signal generated by voltage monitor 2550 to control gas supply valve 2521 and control device 2548 allows for a stable electron field output from emitter 2510.

The current generated by emitter 2510 may be determined by the density of the cations impacting the cathode 2518. The density of the cations impacting the cathode 2518 may be controlled by adjusting the voltage on wire electrode 2516 through control device 2548v. The energy of the electrons emitted from the cathode 2518 may be controlled by adjusting the voltage on the cathode 2518 through power supply 2522. Both current and energy of the emitted electrons can be independently controlled, and the relationships between these parameters and the applied voltages are linear, rendering control of the emitter 2510 both efficient and effective. In contrast, conventional thermo-ionic electron beam guns cannot be controlled in a corresponding linear manner when adjusting beam parameters.

Figure 9:
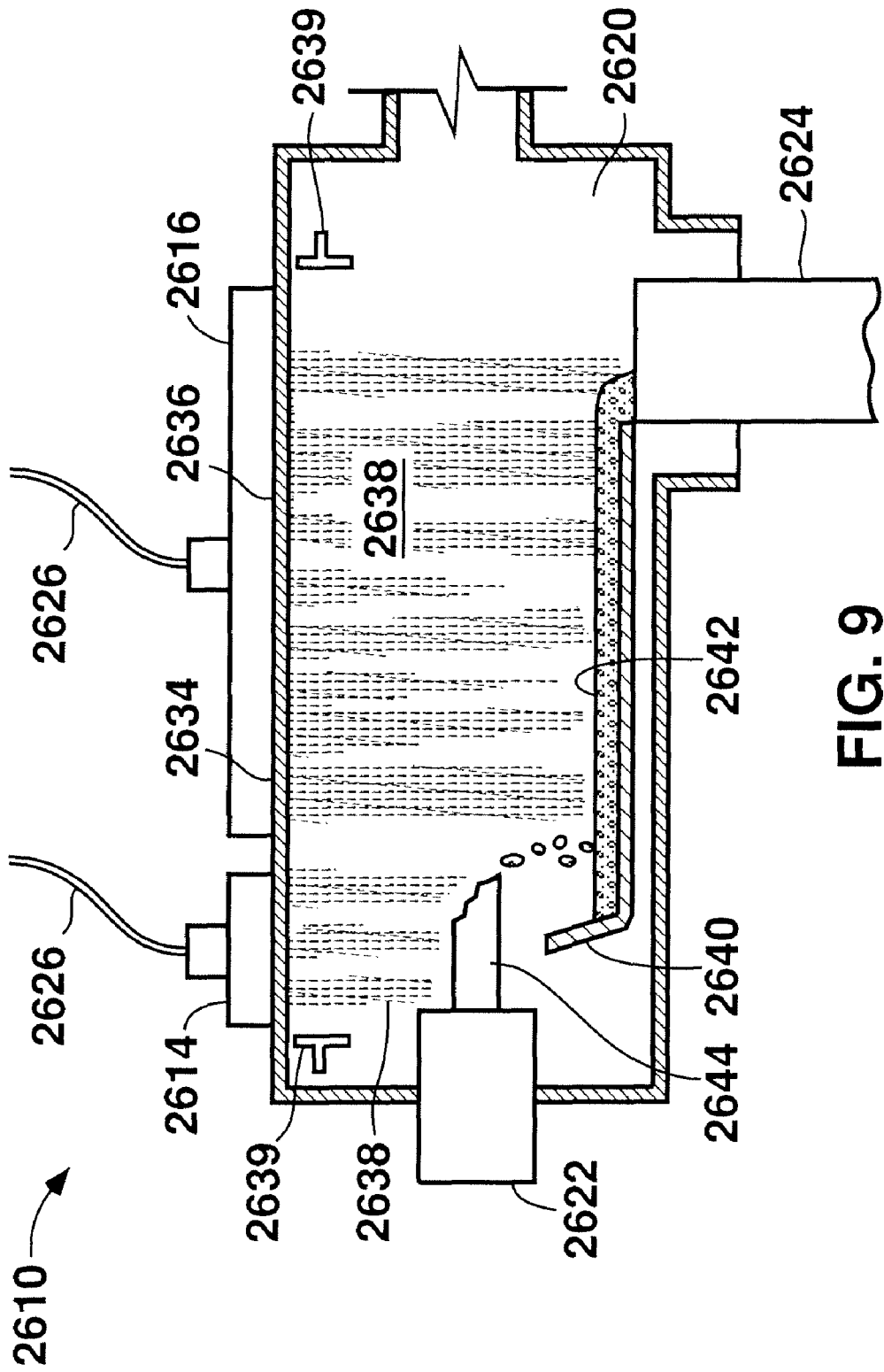
FIG. 9 is a schematic illustration in cross-section of one embodiment of an electron beam cold hearth melting apparatus according to the present disclosure.

FIG. 9 is a schematic illustration of one embodiment of an electron beam melting apparatus according to the present disclosure, wherein the apparatus 2610 incorporates two wire-discharge ion plasma electron emitters 2614, 2616 having a design as generally shown in FIGS. 7 and 8 and as discussed above in connection with those figures. Melting assembly 2610 includes melting chamber 2620, material feeder 2622, and atomizing assembly 2624. Current required for operation of emitters 2614 and 2616, as discussed above, is fed to the emitters by power lines 2626, and the interface between emitters 2614, 2616 and the melting chamber 2620 includes electron transmissive foil windows 2634, 2636, which allow the electron fields 2638 generated by the emitters 2614, 2616 to enter the melting chamber 2620. The foil windows 2634, 2636 may be omitted if the operating pressures within the emitters 2614, 2616 and the melting chamber are identical or do not significantly differ. Means 2639 for magnetically steering electron fields 2638 may be included within melting chamber 2620 to provide additional process control. A hearth 2640, which may be, for example, a cold hearth, is disposed in melting chamber 2620. In operation, wire-discharge ion plasma electron emitters 2614, 2616 are energized and generate electron fields 2618. An electrically conductive feed material 2644 is introduced into the melting chamber 2620 by feeder 2622, is melted by electron field 2638 emitted from emitter 2614, and drops to hearth 2640. Wide-area electron field 2638 emitted by emitter 2616 heats, degasses, and refines the molten material 2642 while resident in hearth 2640. Molten material 2642 advances along the hearth 2640 and drops into atomizing assembly 2624 and is processed to form an ingot or other preform.

As used herein, the term "atomizing assembly" refers to an apparatus that impinges at least one stream of electrons (e.g., a linear two-dimensional electron beam produced by a thermo-ionic electron beam emitter, for example) or a field of electrons (e.g., a three-dimensional wide-area electron field produced by a wire-discharge ion plasma electron emitter, for example) on molten alloy from the melting assembly. As just used, "impinges" means to bring into contact. In this way, the electrons impart a charge to the impinged region of the stream and/or to the individual molten alloy droplets. As discussed in U.S. Pat. No. 6,722,961 and below, once the charge in a droplet or a particular region of a stream reaches a sufficient magnitude, the region or droplet becomes unstable and is disrupted (atomized) into small molten alloy particles. (As used herein, "molten alloy particles" refers to particles that may include some content of molten material, but which are not necessarily entirely molten. Accordingly, molten alloy particles may comprise liquid and solid metal components). Such an atomizing apparatus may be variously referred to herein as an electron beam atomizing assembly, apparatus, device, or the like.

Essentially, as discussed in U.S. Pat. No. 6,722,961, a fundamental feature of an electron beam atomizing apparatus is that it is designed to rapidly apply an electrostatic charge to a stream or droplets of molten alloy. The apparatus is adapted so that the electrostatic charge imparted to the molten alloy physically disrupts the stream or droplet and produces one or more small molten alloy particles from the molten alloy, thereby atomizing the material. Atomization of molten material using rapid electrostatic charging through impingement by electrons results in the rapid breakup of the material into small particles due to electrostatic repulsion forces set up within the material. More specifically, the region or droplet of molten alloy is rapidly electrostatically charged beyond the "Rayleigh limit", such that the electrostatic forces within the region or droplet exceed the surface tension of the material and the material breaks up into small particles. The Rayleigh limit is the maximum charge a material can sustain before the electrostatic repulsions set up within the material exceed the surface tension holding the material together. Advantages of an atomization technique utilizing the impingement of electrons on a material to set up electrostatic charge repulsion with the material include the capability to conduct the technique within a vacuum environment. In this way, chemical reactions between the atmosphere or an atomizing fluid with the molten material can be limited or eliminated. This capability contrasts with conventional fluid atomization, wherein the material being atomized necessarily contacts the atomizing gas or liquid and is typically conducted in ambient air or in inert gas for titanium-base alloys and nickel-base superalloys.

The stream or droplets atomized by the atomizing assembly is produced by the upstream melting assembly. The melting assembly may include, for example, a dispenser for forming a suitable stream or droplets. In certain non-limiting embodiments, such as those disclosed in U.S. Pat. No. 6,722,961, the dispenser may include a melt chamber having an orifice. The stream and/or droplets are forced or otherwise emerge from the orifice and pass downstream to the atomizing assembly. In certain non-limiting embodiments, the molten alloy stream or droplets emerge from the orifice of a melt chamber under the influence of mechanical action, pressure, or gravity. In one possible embodiment, pressure is applied to the molten alloy in a dispenser of a melting assembly in a magnitude greater than the pressure on the outside of the dispenser to produce molten alloy droplets at an orifice in the dispenser. Also, in one embodiment the pressure may be varied so as to selectively interrupt the flow of the molten alloy droplets.

Certain non-limiting embodiments of the melting assembly may be designed to "pre-charge" the molten metal stream or droplets presented to the atomizing assembly with a negative charge. Pre-charging the stream or droplets would reduce the amount of negative charge required from the electron beam atomizing assembly to atomize the stream or droplets into small particles. One possible technique for pre-charging is to maintain the melt assembly at a high negative potential relative to other elements of the apparatus. This can be accomplished by electrically isolating the melt assembly from other elements of the apparatus, and then raising the negative potential of the melting assembly to a high level using a power supply electrically coupled to the melting assembly. An alternative pre-charging technique is to position an induction ring or plates upstream of the atomizing assembly in a position close to the exit orifice of the melting assembly. The ring or plates, or perhaps other structures, are adapted to induce a negative charge in the droplets or stream passing a short distance downstream to the atomizing assembly. The atomizing assembly would then impinge electrons on the pre-charged material to further negatively charge and atomize the material. Other pre-charging techniques will be apparent upon considering the present disclosure.

In certain embodiments of the atomizing assembly according to the present disclosure, charge is imparted to the molten alloy stream and/or droplets by way of a thermo-ionic emission source, a wire-discharge ion plasma electron emission source, or a like device. As is known in the art, the thermo-ionic emission phenomenon, at one time known as the "Edison effect", refers to the flow of electrons (referred to as "thermions") from a metal or metal oxide surface when thermal vibrational energy overcomes the electrostatic forces holding electrons to the surface. The effect increases dramatically with increasing temperature, but is always present to some degree at temperatures above absolute zero. A thermo-ionic electron gun utilizes the thermo-ionic emission phenomenon to produce a stream of electrons with a well defined kinetic energy. As is known in the art, thermo-ionic electron guns generally comprise (i) a heated electron-producing filament, and (ii) an electron accelerating region, which is bounded by a cathode and an anode. The filament typically consists of a piece of refractory material wire, which is heated by passing an electric current through the filament. Suitable thermo-ionic electron gun filament materials have the following properties: low potential barrier (work function); high melting point; stability at high temperatures; low vapor pressure; and chemical stability. Certain embodiments of thermo-ionic electron guns include, for example, tungsten, lanthanum hexaboride ($LaB_6$), or cerium hexaboride ($CeB_6$) filaments. Electrons "boil away" from the surface of the filament upon application of sufficient thermal energy generated by the applied current, but electrons produced in this way have very little energy. To address this, a positive electrical potential is applied to the anode. The electrons produced at the filament drift through a small hole in the cathode, and the electric field in the region between the anode and the positively charged cathode accelerates the electrons across the gap to the anode, where they pass through a hole in the anode with a final energy corresponding to the applied voltage between the electrodes. Thermo-ionic electron guns are commercially available and their construction and manner of operation are well known.

In order to negatively charge the droplets or stream to a level necessary to overcome surface tension and atomize the material, the droplets or stream must be subjected to a flow or field of electrons of sufficient energy and intensity for a finite period of time. Thus, the atomizing assembly preferably produces a three-dimensional electron field that extends a suitable distance along the path traveled through the atomizing assembly by the droplets or stream. A three-dimensional electron field, wherein the electrons are spatially distributed, may be contrasted with a point source electron beam emitter, wherein the electrons are focused in a narrow linear beam. Spatial distribution of the electrons may be important in the apparatus of the present disclosure given that the droplets or stream of molten material introduced to the atomizing assembly is moving through the assembly under the influence of gravity.

Without intending to be bound to any particular theory, it appears that electron beam atomized particles may be formed from a molten droplet or stream by one or both of the following mechanisms. In a first possible mechanism, new atomized particles are sequentially stripped from the surface of the droplet or stream as negative charge is added to the droplet or stream. Another possible mechanism is that atomized particles are formed by a cascading effect in which the initial molten stream or droplet breaks up into small particles, the particles are recharged to negative potential and break up into yet smaller particles, and the process repeats during the time in which electrons are added to the successively smaller atomized particles. Under either mechanism, the molten material must be exposed to the electron field for a sufficient time so that sufficient negative charge accumulates in and disrupts the material.

One possible spatial distribution of electrons within the electron field generated in the atomizing assembly is in the form of a cylinder of electrons. The longitudinal axis of the cylinder may be oriented in the general direction of travel of the molten material through the atomizing assembly. The minimum length of the cylinder (along the longitudinal axis) required for complete atomization will depend on the time it takes the free falling molten material to be atomized by the electron field given the energy and intensity of the electron field within the cylinder.

Non-cylindrical electron field shapes also may be used, such as, for example, fields having a transverse cross-section (transverse to the molten material's general direction of travel through the atomizing assembly) that is rectangular, triangular, or some other polygonal or otherwise bounded shape. More generally, however, fields of any combination of energy, intensity, and three-dimensional shape capable of suitably atomizing the molten material may be used. Non-limiting prophetic embodiments of an electron beam atomizing assembly for an apparatus constructed according to the present disclosure are discussed herein.

According to one possible non-limiting embodiment of an atomizing assembly according to the present disclosure, a source of electrons having sufficient energy to atomize the molten droplets or stream is provided. The electron source may be, for example, at least one of a heated tungsten filament and a wire-discharge ion plasma electron emitter. The electrons stripped from the tungsten filament are manipulated using electrostatic and/or electromagnetic means to form a beam of electrons having a cross-section that is in the form of a rectangle with a large aspect ratio (the ratio of beam width to beam length). The rectangular-shaped beam is then projected into the atomizing chamber as a generally block-shaped field across the path of travel of the molten material.

In various embodiments, the electron generating devices may be thermo-ionic beam emitters. Possible alternative electron generating devices that may be used to produce electrons in certain embodiments of atomizing assemblies according to the present disclosure are cold cathode wire ion generators and plasma ion emitters, such as a wire-discharge ion plasma electron emitter, for example. Cold cathode wire ion emitters typically produce an electron field having a generally rectangular cross-section. One advantage of a cold cathode ion generator is that it produces an electron emission at temperatures lower than a thermo-ionic electron generator. The design of both cold cathode wire ion generators and plasma ion emitters, and their manner of operation to produce electrons, are generally known in the art (for example, see U.S. Pat. Nos. 4,694,222; 4,755,722; and 4,786,844). Therefore, further description of such devices is not provided herein. Electrons produced by the particular electron-generating device or devices within the atomizing assembly may be suitably manipulated, such as using electromagnetic and/or electrostatic fields, to form a beam of electrons having a suitable cross-section. The electron beam may then be projected into the atomizing chamber across the path of travel of the molten material.

Figure 10:
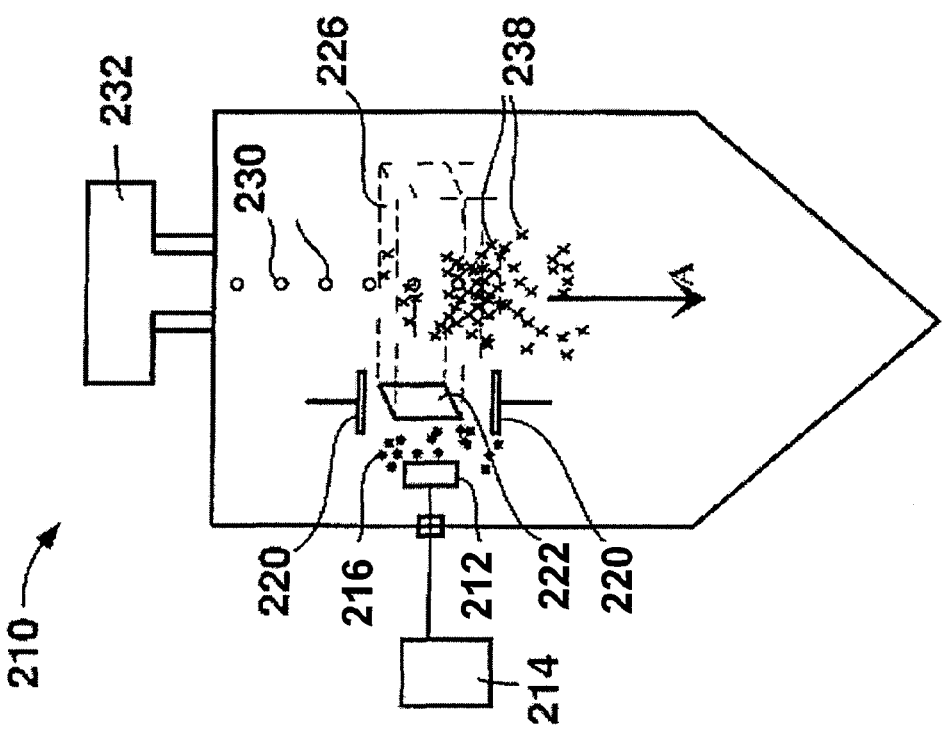
FIG. 10 is a schematic representation of aspects of one non-limiting embodiment of an apparatus constructed according to the present disclosure, wherein a generally block-shaped field of electrons is generated in the pathway of molten alloy passing through an atomizing assembly.

FIG. 10 schematically illustrates this arrangement, wherein atomizing assembly 210 includes tungsten filament 212 that is heated by flow of current from power supply 214. Heated filament 212 generates free electrons 216. The electrons may be generated in this way using, for example, a thermo-ionic electron beam emitter. However, the electrons may also be generated using at least one wire-discharge ion plasma electron emitter (not shown). The electrons are shaped by an electrostatic field generated by plates 220 to form a generally rectangular-shaped electron beam 222. The electron beam 222 is projected into the interior of the atomizing assembly 210 to produce a generally block-shaped electron field 226. Molten metal droplets 230 dispensed from the upstream melting assembly 232 pass through the electron field 226 and are atomized to smaller particles 238 through disruption by accumulation of negative charge. The atomized particles 238 pass in the direction of arrow A toward a collector (not shown).

Figure 11:
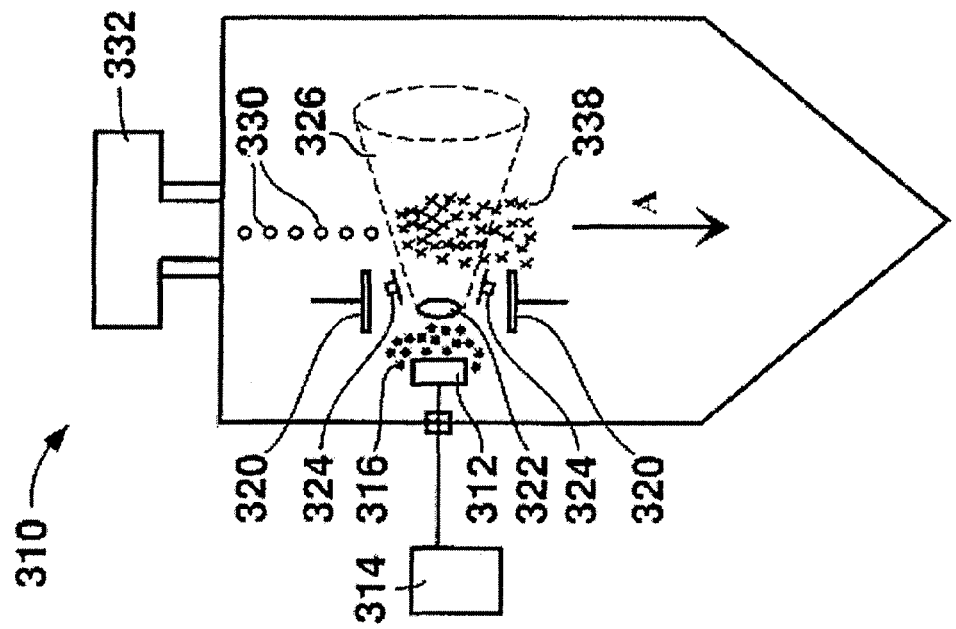
FIG. 11 is a schematic representation of aspects of one non-limiting embodiment of an apparatus constructed according to the present disclosure, wherein a rastering apparatus generates a field of electrons in the pathway of molten material passing through an atomizing assembly.

FIG. 11 illustrates an additional non-limiting embodiment of an atomizing assembly 310 according to the present disclosure. One or more tungsten filaments 312 are heated by power supply 314 and produce electrons 316 having sufficient energy to atomize molten metal when impinged on the molten metal in sufficient quantities. The electrons may be generated in this way using, for example, a thermo-ionic electron beam emitter. However, the electrons may also be generated using at least one wire-discharge ion plasma electron emitter (not shown). The electrons 316 are manipulated by structures such as, for example, plates 320 to form a diffuse spot 322. Rastering apparatus 324 rasters the electron spot 322 at a high raster rate within the region of the atomizing assembly through which the molten material passes under the influence of gravity. The effect of the high raster rate is to provide a three-dimensional electron field 326 having a controlled shape in the atomizing chamber of the atomizing assembly 310 that is large enough to completely or substantially completely atomize the molten metal droplets 330 introduced by the melting assembly 332 to smaller atomized particles 338. The atomized particles 338 pass in the direction of arrow A to a collector (not shown).

Figure 12:
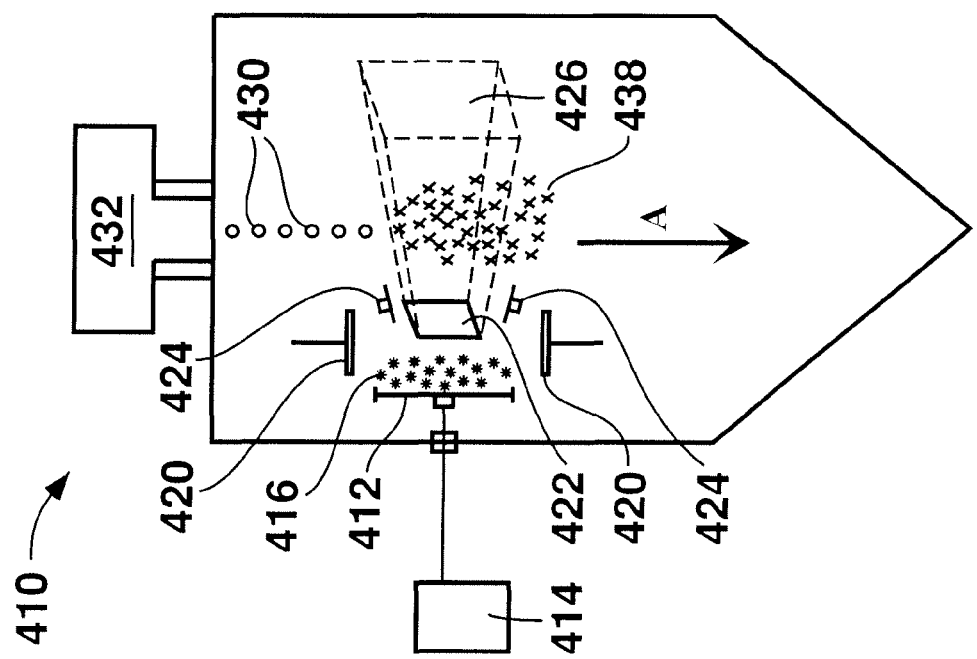
FIG. 12 is a schematic representation of aspects of one non-limiting embodiment of an apparatus constructed according to the present disclosure, wherein electrons used to produce an electron field in the pathway of molten material passing through an atomizing assembly are generated from the outer surface of a filament.
Figure 14:
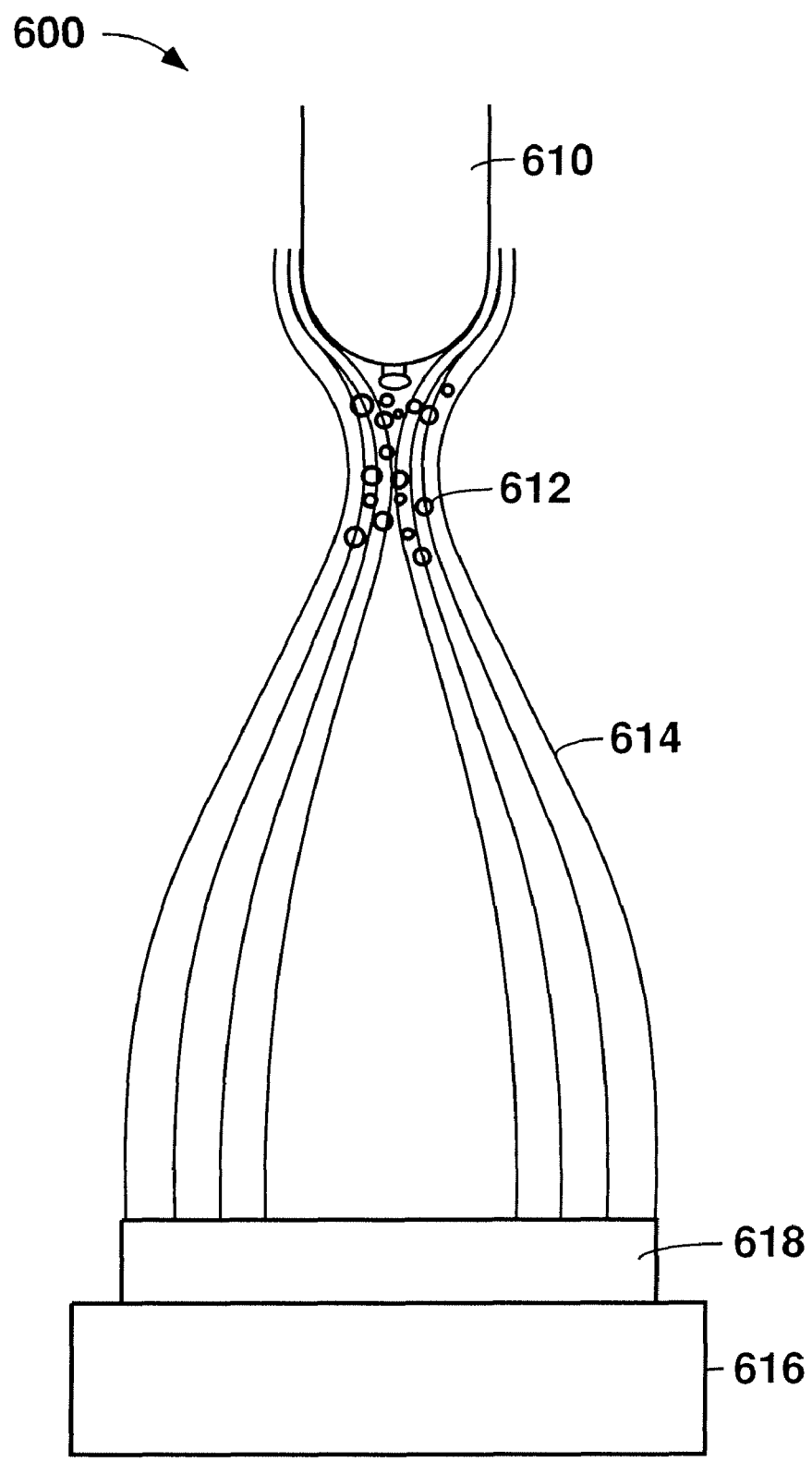
FIGS. 14, 15, 15A, 16, 16A, 17, and 17A are schematic representations of elements of different non-limiting embodiments of apparatus constructed according to the present disclosure, adapted for spray forming a preform such as, for example, an ingot.
Figure 15A:
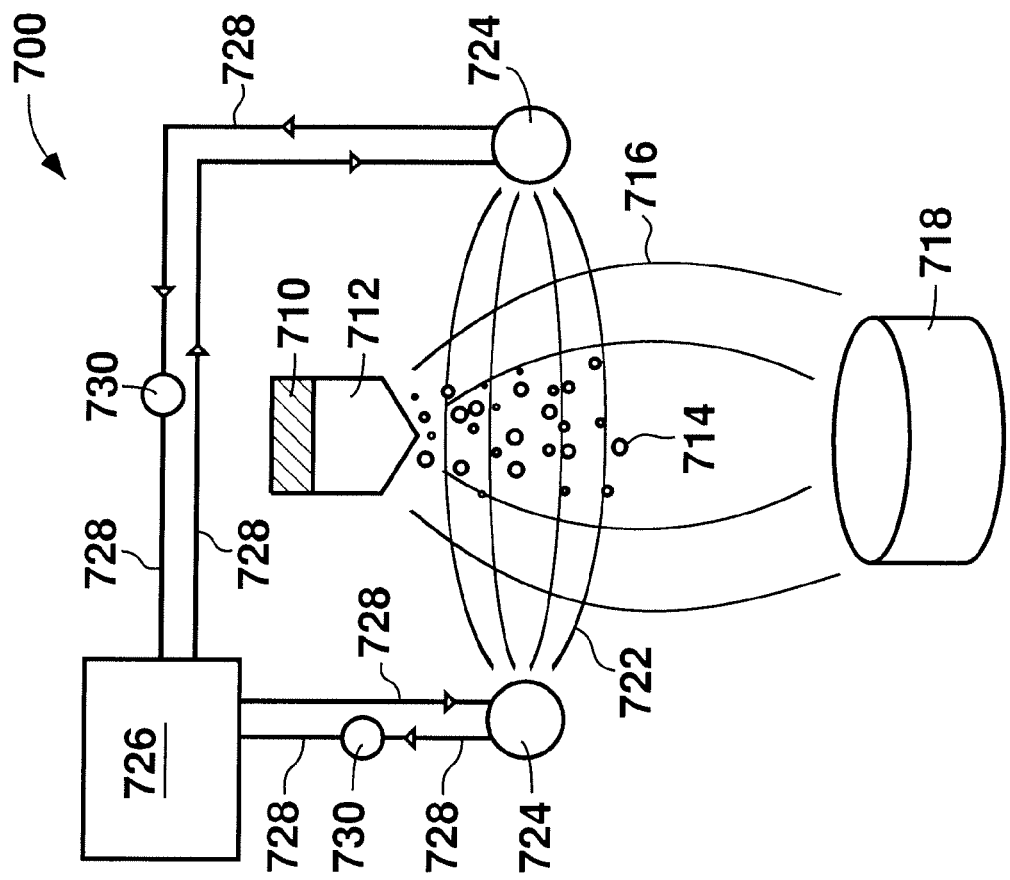
Figure 15:
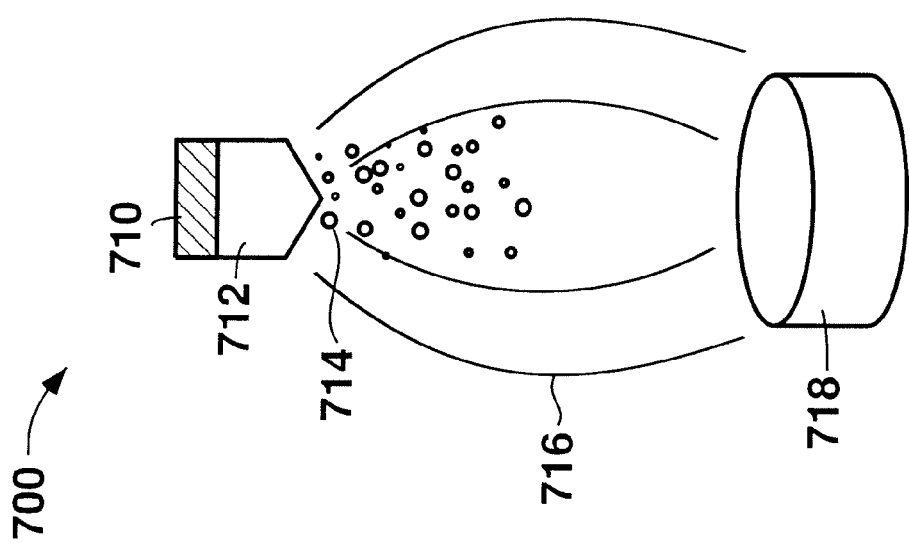
Figure 16A:
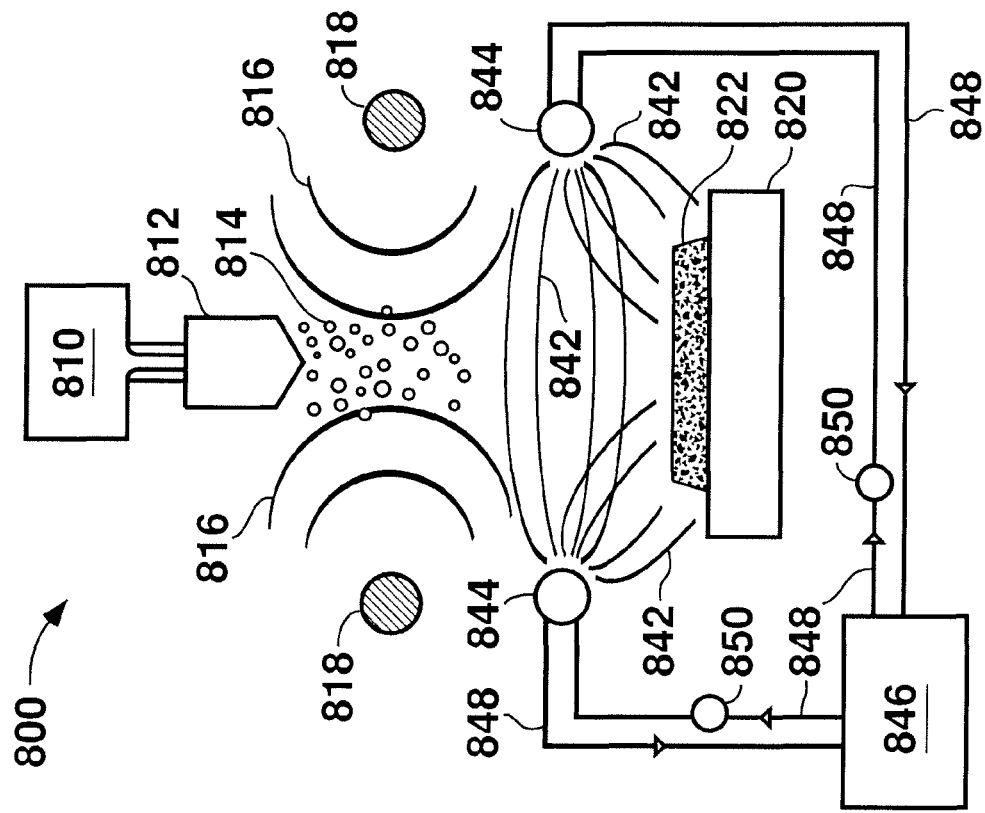
Figure 16:
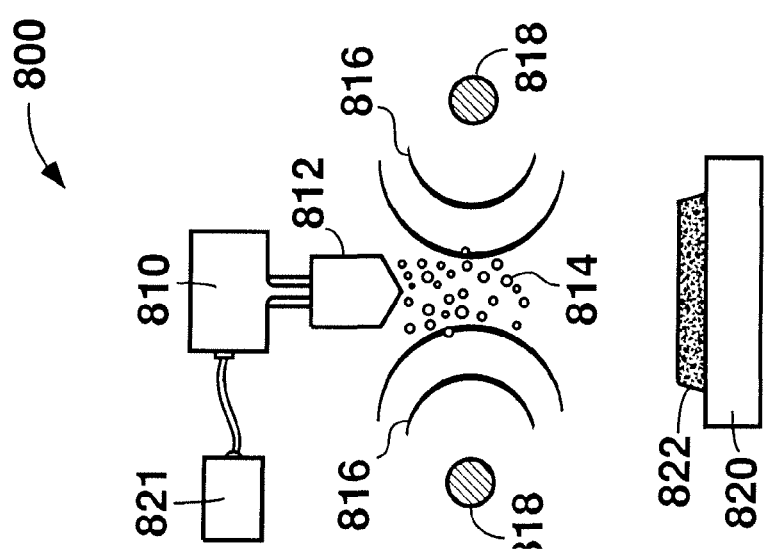

A further embodiment of an atomizing assembly useful in an apparatus according to the present disclosure is shown in FIG. 12. Atomizing assembly 410 produces an electron field having a large generally rectangular cross section. The electrons are generated from the surface of a generally straight length of tungsten filament 412 heated by power supply 414. This means of generating electrons contrasts with the technique of generating electrons from a point source, as is typically done in electron beam guns. This means of generating electrons may be a wire-discharge ion plasma electron emitter. The electrons 416 emanating from the surface of the filament 412 may be manipulated using electrostatic or electromagnetic fields, such as, for the example, the electromagnetic field generated by plates 420, to form a beam 422 having a generally rectangular cross section. The rectangular electron beam 422 may be rastered at a high raster rate by a rastering apparatus into the atomizing assembly 410 to form an electron field through which molten material 430 sourced from melting assembly 432 passes. Alternatively, as shown in FIG. 4, the rectangular electron beam 422 may be projected into the atomizing assembly 410 by projecting device 424 to form an electron field 426, having a generally rectangular cross section, through which molten material 430 sourced from melting assembly 432 passes. The material 430 is disrupted by accumulation of negative charge into atomized particles 438, which pass to a collector (not shown) in the direction of arrow A.

To provide sufficient electrons to suitably atomize molten material, any of the foregoing embodiments may be modified to include multiple sources of electrons at suitable positions within the atomizing assembly. Multiple means for manipulating and projecting/rastering the electrons also may be utilized to generate a suitable electron field. For example a number of thermo-ionic or non-thermo-ionic electron beam emitters or other electron sources may be oriented at specific angular positions (for example, three at 120 degrees to one another) about the pathway of the molten material in the atomizing chamber and generate a three-dimensional field of electrons by projecting the electrons from the multiple sources into the pathway.

Also, aspects of the several atomizing assembly embodiments described above could be combined. For example, in one alternate embodiment combining aspects of the embodiments shown in FIGS. 10 and 11, the rectangular beam 222 of the atomizing assembly 210 is rastered using the rastering apparatus 324 in atomizing assembly 310 to produce an electron field to atomize the molten material. Relative to electron spot 322, rastering the relatively high aspect ratio rectangular electron beam 222 may provide larger linear coverage along the path of the molten material in the atomizing chamber.

In certain embodiments of an electron beam atomizing assembly included in an apparatus according to the present disclosure, a first flow or stream of electrons is impinged on material emerging from the melting assembly, thereby atomizing the material to primary molten alloy particles having a first average size. Impinging a second stream of electrons on the primary particles further atomizes the particles to a smaller average particle size. Further reductions in average size may be achieved by impinging additional electron flows or streams on the atomized particles. In this way, several size refinements are possible using rapid electrostatic charging by impingement of electrons. In certain embodiments, rapid electrostatic charging by an electron beam is applied two, three, or more times along a pathway to achieve a final desired average molten material particle size. In this way, the original size of molten alloy droplets produced by the melting assembly need not limit the size of the final atomized particles produced in the atomizing assembly. The multiple electron sources in such an arrangement may be, for example, individual thermo-ionic electron beam emitters, including linear thermo-ionic electron beam emitters.

Figure 13:
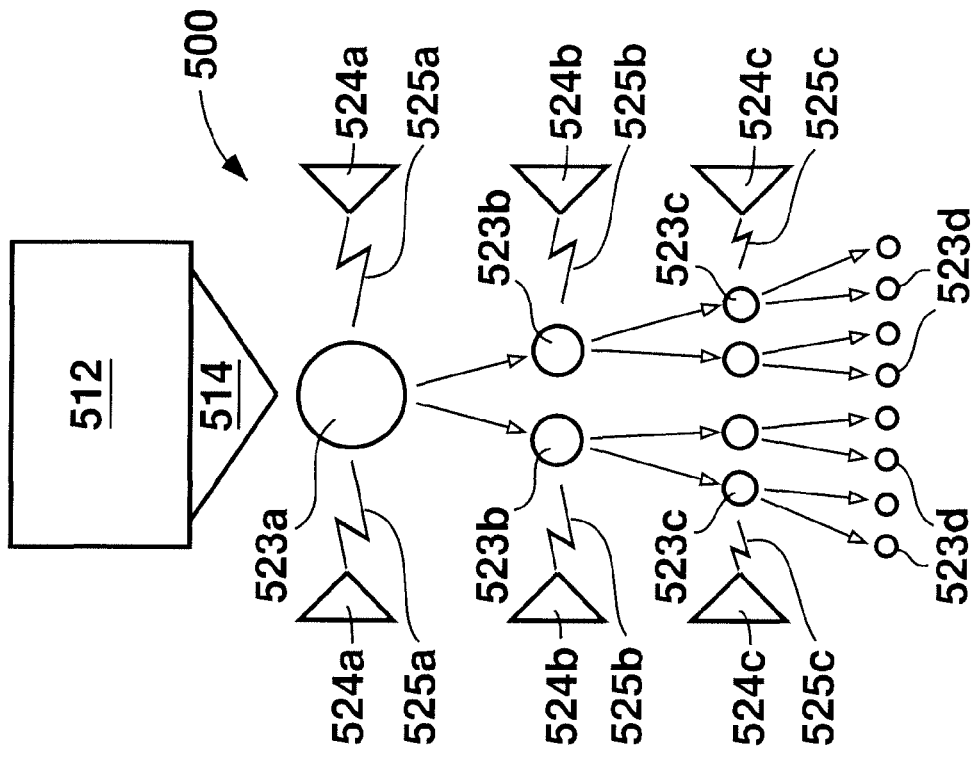
FIG. 13 is a schematic representation of one embodiment of an electron beam atomizing assembly that may be included in an apparatus constructed according to the present disclosure.

Accordingly, in certain non-limiting embodiments of an atomizing assembly according to the present disclosure, a droplet or a portion of a stream of molten alloy undergoes two or more stages of atomization to successively reduce the average the size of the resulting atomized particles. This may be accomplished, for example, by appropriately positioning two or more electron guns or other sources of flows or streams of electrons along a pathway in a region between the atomizing assembly and the collector. The pathway is coincident with the flow path of the molten alloy. An atomizing assembly having this general construction is schematically illustrated as assembly 500 in FIG. 13. A melting assembly 512 includes a dispenser 514 that produces a molten alloy droplet 523a. The dispenser 514 may use, for example, mechanical means or pressure to produce the molten alloy droplet 523a from molten material produced from an ingot, charge, scrap, or other source in the melting assembly 512. Primary electron beam guns 524a generate streams of electrons 525a that impinge on droplet 523a and impart a negative charge to the droplet. The electrostatic forces set up within the droplet 523a eventually exceed the droplet's surface tension energy, disrupting the droplet and forming primary molten alloy particles 523b. Secondary electron beam guns 524b focus streams of electrons 525b on primary molten alloy particles 523b, similarly imparting negative charge to the particles and disrupting them into smaller secondary molten alloy particles 523c. Tertiary electron beam guns 524c focus streams of electrons 525c on secondary molten alloy particles 523c, also imparting negative charge to the particles and disrupting them into yet smaller tertiary molten alloy particles 523d. In one embodiment of this arrangement, the several electron beam guns are thermo-ionic electron guns, although any other suitable device for generating suitable streams of electrons may be used, such as a wire-discharge ion plasma electron emitter, for example.

As discussed in U.S. Pat. No. 6,722,961, "rapid" electrostatic charging refers to charging to a desired magnitude within about 1 to about 500 microseconds, preferably about 1 to about 100 microseconds, and more preferably about 1 to about 50 microseconds. The rapid electrostatic charging of molten alloy produced by the melting assembly produces charges exceeding the Rayleigh limit of the material, and thereby produces a plurality of molten alloy particles. The particles, for example, may have a generally uniform diameter of, for example, about 5 to about 2500 microns, more preferably about 5 to about 250 microns.

Accordingly, the atomizing assembly generates molten alloy particles, which are further processed in the apparatus to form a monolithic (i.e., one-piece) preform such as an ingot. As used herein, the term "preform" refers to any casting, workpiece, or other article that is formed by collecting together molten alloy particles, such as an ingot, for example. In the apparatus and method of the present disclosure, all or a portion of the molten alloy particles produced by the atomizing assembly are controlled downstream of the atomizing assembly and collected in a collector. More specifically, apparatus according to the present disclosure include at least one field generating assembly that generates an electrostatic field and/or an electromagnetic field that is at least partially present in a region downstream of the atomizing assembly. The electrostatic field and/or electromagnetic field generated by the field generating assembly is structured and/or manipulated so as to influence at least one of the acceleration, speed, direction of the molten alloy particles that interact with the field.

As used herein, the term "field generating assembly" refers to an apparatus that generates and, optionally, manipulates, one or more electrostatic and/or electromagnetic fields that may be used to control at least one of the acceleration, speed, direction of molten alloy particles in a region downstream of the atomizing assembly. Embodiments of field generating assemblies are described in U.S. Pat. No. 6,722,961, which has been incorporated by reference herein.

As used herein, "electrostatic field" may refer to a single electrostatic field or a plurality of (two or more) electrostatic fields. An electrostatic field may be generated by, for example, charging a point, plate, or other source to high potential. Also as used herein, "electromagnetic field" can refer to a single electromagnetic field or a plurality of electromagnetic fields. An electromagnetic field may be created by, for example, passing electric current through a conductor, such as a metallic coil, for example.

In certain embodiments of an apparatus and method according to the present disclosure, all or a portion of the molten alloy particles generated by the atomizing assembly and passing within or through the field(s) produced by the field generating assembly are collected in or on a collector as a preform. As used herein, the term "collector" refers to an apparatus, element, or portion or region of an apparatus or element, or an assemblage of elements, that is adapted to receive or collect all or a portion of the molten alloy particles produced by the atomizing assembly in the form of a preform. Non-limiting examples of a collector that may be incorporated into embodiments of an apparatus or method according to the present disclosure include the entirety or a portion or region of a nucleated casting mold, a platen, a mandrel, or a surface. Typically, the collector is at ground potential or, preferably, is at a high positive potential so as to attract the negatively charged atomized particles generated by the atomizing assembly. When the apparatus is adapted to spray forming an ingot or other preform, the collector may be, for example, a platen or a mandrel, which may be adapted to rotate or otherwise translate to suitably form a solid article of the desired geometry. When the apparatus is adapted for nucleated casting of a solid article, an ingot for example, the collector typically is in the form of a mold including a void having the geometry of the desired cast article.

The general arrangement illustrated in FIG. 1, i.e., an apparatus combining a melting assembly, an atomizing assembly, a field generating assembly, and a collector, may be designed and operated to conduct spray forming so as to produce an ingot or other solid preform on a surface of the collector, which in such case may be, for example, a platen or a mandrel. The combination may further be designed to conduct nucleated casting to form a solid cast article on or in the collector, which in such case may be, for example, a mold including one or more side walls.

In certain non-limiting embodiments of an apparatus according to the present disclosure designed to conduct spray forming or nucleated casting, for example, the field generating assembly generates one or more electrostatic and/or electromagnetic fields that interact with and direct molten alloy particles to various regions of the developing preform at various times during the forming process.

Also, the electrostatic and/or electromagnetic fields can be used to direct molten alloy particles to areas of a developing preform where it is desired to add or remove heat, thereby influencing the macrostructure of the preform. In conducting spray forming or nucleated casting, for example, the shape of the one or more electrostatic and/or electromagnetic fields can also be manipulated to produce near-net shape preforms by directing particles to predetermined regions on the developing preform at various times during the forming or casting process. By employing one or more electrostatic and/or electromagnetic fields using the field generating assembly, it is possible to enhance the yield of the forming or casting process, as well as improve (and control) the density of the resulting preform.

Accordingly, the present disclosure describes methods and apparatus including means for generating one or more electrostatic and/or electromagnetic fields for selectively controlling, for example, one or more of the yield, quality, and density of solid workpieces (preforms) produced from molten material. Methods of directing atomized materials utilizing electrostatic and/or electromagnetic fields in spray forming are expected to provide significantly enhanced yields and to provide solid preforms having densities that are significantly greater than conventionally-formed preforms.

In one embodiment of an apparatus according to the present disclosure, the field generating assembly generates an electrostatic field in a region between the atomizing assembly and the collector by electrically coupling the collector to a high voltage DC power supply and grounding the atomizing assembly. Given that electron atomization is used in the present apparatus and method and the atomized particles will be negatively charged, negative polarity is used. The electrostatic field may react with the negatively charged molten alloy particles produced by the atomizing assembly and the particles are influenced to move in the general direction of the electrostatic field lines. This interaction can be used to control one or more of the acceleration, speed, direction of the molten alloy particles toward the collector.

In addition to a high voltage DC power supply, the field generating assembly included in certain embodiments of an apparatus constructed according to the present disclosure can comprise one or more electrodes disposed at suitable positions and in suitable orientations so as to generate suitable field(s) between the atomizing assembly and the collector. The electrodes are positioned and oriented to shape the electrostatic field between the atomizing means and the collector in a desired manner. The electrostatic field provided under the influence of the one or more electrodes can have a shape that directs the molten alloy particles in a desired manner to the collector.

The field generating assembly can also comprise a plurality of high voltage DC power supplies, each attached to one or more electrodes disposed at suitable positions and in suitable orientations between the atomizing assembly and the collector, and that influence the shape of the electrostatic field generated by the field generating assembly between the atomizing assembly and the collector in a time-dependent manner. In this way, the field may be manipulated to suitably direct molten alloy particles generated by the atomizing assembly to specific areas or points on the collector or on the developing preform over time. For example, a field generating assembly including a plurality of electrodes and associated power supplies can be incorporated in an apparatus according to the present disclosure adapted to produce near-net shape solid articles by spray forming. A field generating assembly including a plurality of electrodes and associated power supplies also could be employed to produce solid preforms by spray forming or nucleated casting having high density relative to preforms produced by conventional spray forming and nucleated casting apparatus. In such embodiments, the electrostatic field may be varied in terms of strength and/or shape to suitably direct the particles of molten material to the collector in a manner akin to the relatively crude mechanical rastering movement of the atomizing nozzle in a conventional spray forming or nucleated casting apparatus lacking a field generating assembly.

In another embodiment of an apparatus according to the present disclosure, an electromagnetic field is produced between the atomizing assembly and the collector by one or more magnetic coils positioned intermediate the atomizing assembly and the collector. The magnetic coils are electrically connected to a power supply, which energizes the coils. Molten alloy particles produced by the atomizing assembly are directed along the field lines of the electromagnetic field to the collector. Preferably, the position and/or orientation of the one or more magnetic coils can be adjusted so as to direct the molten particles to specific areas or points on the collector or the developing preform. In this way, molten alloy particles can be directed to enhance the density of preforms or even produce near-net shape preforms during spray forming or nucleated casting.

In yet another embodiment of an apparatus according to the present disclosure, a plurality of magnetic coils is disposed between the atomizing assembly and the collector. The electromagnetic fields generated by the plurality of magnetic coils, which may be singly or multiply energized to different magnetic field intensities, influence the direction of movement of the molten alloy particles produced by the atomizing assembly, directing the particles to specific predetermined areas or points on the collector or on the developing preform. By this arrangement, the molten alloy particles can be directed in predetermined patterns to produce, for example, solid preforms having near-net shape and/or relatively high density. In certain embodiments, the fields generated by the field generating assembly may be used to improve or refine the directional control already available through the use of translatable atomizing nozzles in conventional spray forming and nucleated casting equipment. In certain embodiments, the substantial directional control attainable solely by appropriately manipulating field shape, direction, and/or intensity, can entirely replace the movement of atomizing nozzles in conventional spray casting equipment.

Certain embodiments of an apparatus constructed according to the present disclosure address the possibility of overspray by suitably charging the collector. Atomizing a molten stream and/or molten particles using an electron beam results in particles that are negatively charged due to the excess of electrons within the atomized particles. By suitably charging the collector with a charge of opposite sign to the atomized particles, the collector will attract the particles and thereby significantly reduce or eliminate overspray. Overspray is a problematic drawback of conventional spray forming that can result in significantly compromised process yields Several prophetic embodiments of an apparatus constructed according to the present disclosure are shown in the following figures and described in the text below. These prophetic examples are for the purpose of illustration only, and are not intended to limit the scope of the present disclosure or the appended claims. The intended scope of the invention is better described in the appended claims.

FIG. 14 schematically illustrates certain elements of an embodiment of an apparatus 600 according to the present disclosure that is adapted for spray forming a solid preform, such as nickel-base superalloy ingot, for example. Electron beam atomizing assembly 610 produces negatively charged molten alloy particles 612. An electrostatic field 614 is generated between the atomizing assembly 610 and a collector 616. The atomizing assembly 610 receives at least one of a stream and a series of droplets of molten alloy from a melting assembly (not shown) that is substantially free from ceramic in regions that contact the molten material. The charged molten alloy particles interact with the electrostatic field 614, which accelerates the molten alloy particles 612 toward the collector 616. The molten particles 612 form a solid preform 618 on a surface of the collector 616. The field's influence on speed and/or direction of the molten alloy particles 612 may be used to reduce over-spray from the preform 618, thereby enhancing the yield of the spray forming process, and possibly also increasing the density of the preform 618 relative to a density possible without the use of such a field generating assembly.

FIG. 15 schematically illustrates certain elements of an additional non-limiting embodiment 700 of an apparatus constructed according to the present disclosure. Melting assembly 710 supplies at least one of a stream and a series of droplets of molten alloy to electron beam atomizing assembly 712, which produces a spray of charged molten alloy particles 714. Electrostatic field 716 is generated by a field generating assembly between the atomizing assembly 712 and a suitably shaped collector. The field 716 interacts with the charged molten alloy particles 714 to accelerate the particles 714 toward the collector. Particles 714 may be accelerated to a greater extent if the collector is held at a high positive potential. The accelerating force and directional control exerted by field 716 on the charged molten particles 714 may be used to enhance the density of the solid ingot 718, and also may be utilized to produce a near-net shape ingot 718. The collector may be stationary, or may be adapted to rotate or otherwise suitably translate.

As shown in the alternate embodiment of FIG. 15A, apparatus 700 optionally may be modified to include means for generating a non-equilibrium plasma 722 in the path of the molten particles 714 between two heat sink electrodes 724. The electrodes 724 thermally communicate with an outside thermal mass 726 by way of a dielectric liquid which circulates through conduit 728 under the influence of pumps 730. The thermal coupling between the heat sink electrodes 724 and the outside thermal mass 726 by way of the dielectric fluid allows heat to be removed from the molten particles 714 and communicated to the thermal mass 726. The non-equilibrium plasma 722 between the heat sinks 724 may be produced, for example, by means of an AC glow discharge or a corona discharge. The non-equilibrium plasma 722 transfers heat from the molten particles 714 to the two heat sink electrodes 724, which transfer the heat to the outside thermal mass 726. Heat transfer systems or devices generating non-equilibrium plasma and using the plasma to transfer heat to or from atomized molten alloy particles are described in U.S. Pat. No. 6,772,961, the entire disclosure of which has been incorporated herein by reference. In addition, heat transfer systems and devices for generating non-equilibrium plasma and using the plasma to transfer heat to or from articles being cast from molten alloy are described in U.S. Pat. No. 7,114,548, entitled "Method and Apparatus for Treating Articles during Formation", the entire disclosure of which is hereby incorporated herein by reference.

FIG. 16 schematically illustrates certain elements of yet another non-limiting embodiment 800 of an apparatus constructed according to the present disclosure, adapted for spray forming a preform. Melting assembly 810, which may be substantially free from ceramic in regions contacting the molten material, provides at least one of a flow and a series of droplets of a molten alloy to an electron beam atomizing assembly 812. The melting assembly 810 optionally may be held at a high negative potential, such as by optional power supply 821, so as to negatively "precharge" the molten material before it passes to the atomizing assembly 812, thereby reducing the quantum of negative charge that the atomizing assembly 812 must convey to the molten material to atomize the material. Such "precharging" feature also may be used with the other embodiments described herein as a means to, for example, reduce the required quantum of negative charge that must be added to the molten material to atomize the material in the atomizing assembly. Electron beam atomizing assembly 812 produces a spray of charged molten alloy particles 814. Electromagnetic field 816 is produced by a magnetic coil 818 (shown sectioned). The charged molten alloy particles 814 interact with the field 816 and are thereby directed generally toward a collector 820. The directional control of the molten particles 814 exerted by field 816 can reduce over-spray, thereby enhancing yield of the spray forming process, and also can enhance density of the solid preform 822.

As shown in the alternate embodiment of FIG. 16A, non-equilibrium plasma 842 optionally may be generated in the path of the molten alloy particles 814 between two heat sink electrodes 844, which are thermally connected to an outside thermal mass 846 by a dielectric liquid that is circulated through conduits 848 by pumps 850. The thermal communication maintained between the heat sink electrodes 844 and the outside thermal mass 846 allows heat to be removed from the molten alloy particles 814. The non-equilibrium plasma 842 between the heat sink electrodes 844 is produced, for example, by means of an AC glow discharge or a corona discharge. The non-equilibrium plasma 842 also extends from the heat sink electrodes 844 to the electrically grounded solid preform 822 and the collector 820, providing for heat removal from the preform 822 and the collector 820. Accordingly, in apparatus 800 heat is transferred from the molten alloy particles 814, the solid preform 822, and the collector 820 by the non-equilibrium plasma 842 to the heat sink electrodes 844, and then to the outside thermal mass 846.

Figure 17A:
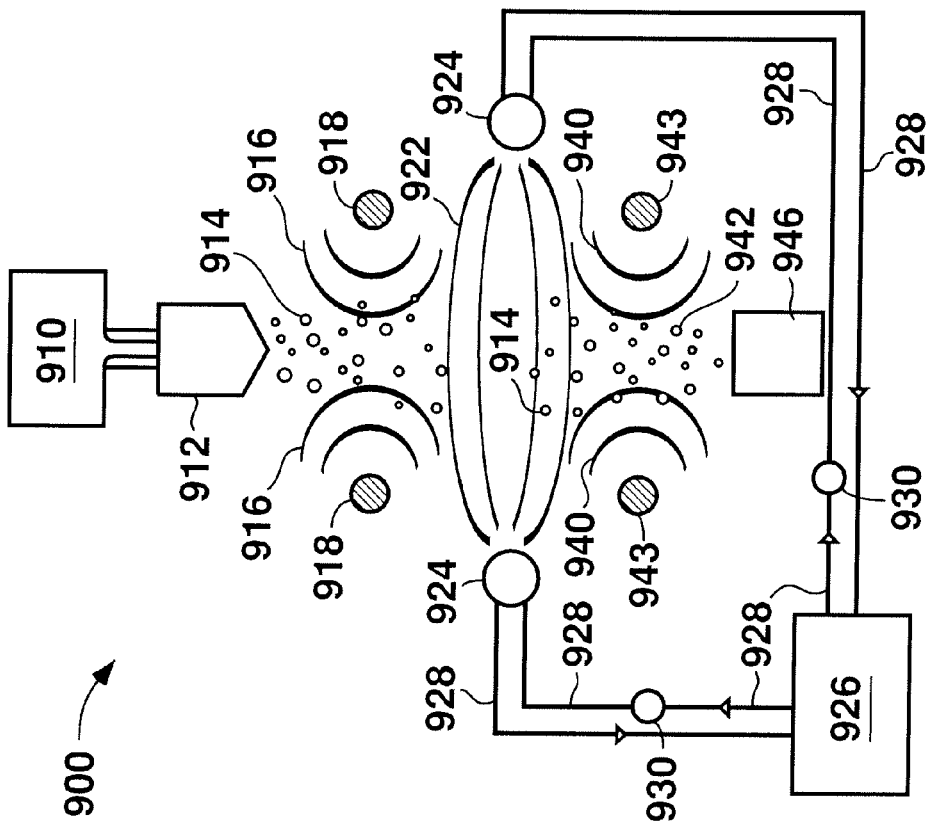
Figure 17:
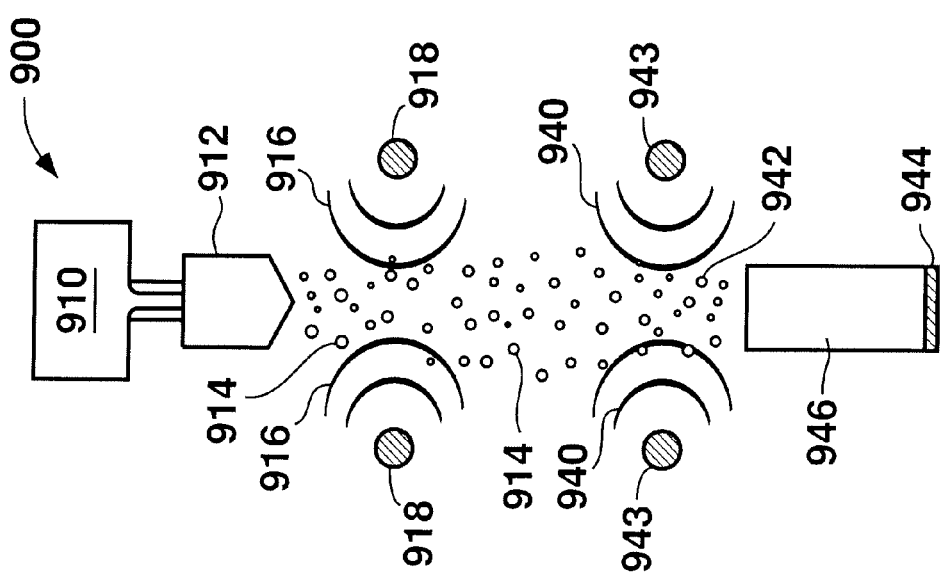

FIG. 17 schematically depicts certain elements of an additional non-limiting embodiment 900 of an apparatus according to the present disclosure, adapted for atomizing molten alloys and forming an ingot. Melting assembly 910 provides at least one of a stream and a series of droplets of a molten alloy to an electron beam atomizing assembly 912. Atomizing assembly 912, which is free from ceramic in regions contacting the molten material, produces charged molten alloy particles 914. Electromagnetic field 916 produced by a magnetic coil 918 (shown sectioned) interacts with the charged molten alloy particles 914 to spread out the particles 914 and reduce the probability of their collision, thereby inhibiting formation of larger molten particles. A second electromagnetic field 940 produced by a magnetic coil 943 (shown sectioned) interacts with and directs the cooled particles 942 toward a collector 944 on which an ingot 946 is developing. This portion of the ingot manufacturing process can be carried out in a vacuum environment to reduce or eliminate contamination of the ingot 942 by chemical interaction with gases.

Optionally, as shown in FIG. 17A, an alternate embodiment of apparatus 900 may be designed so that non-equilibrium plasma 922 is created in the path of the molten particles 914, between two heat sink electrodes 924 that thermally communicate with an outside thermal mass 926 by a dielectric fluid which circulates through conduit 928 by force of pumps 930. The arrangement of heat sink electrodes 924 thermally communicating with outside thermal mass 926 allows heat to be removed from the molten particles 914.

As suggested, for example, in connection with the apparatus of FIG. 17, certain embodiments of an apparatus constructed according to the present disclosure may include a chamber or the like that encloses or contains all or a portion of the melting assembly, atomizing assembly, field generating assembly, collector, and workpiece (the powder or preform, as the case may be). If, for example, a heat transfer device employing non-equilibrium plasma is incorporated in the apparatus, all or a portion of the heat transfer device and its associated electrodes, as well as the non-equilibrium plasma, also may be encompassed within the chamber. Such a chamber can be provided to allow for regulating the atmosphere within the chamber, including the species and partial pressures of gases present and/or the overall gas pressure within the chamber. For example, the chamber may be evacuated to provide a vacuum (as used herein, "vacuum" refers to a complete or partial vacuum) and/or may be completely or partially filled with an inert gas (e.g., argon and/or nitrogen) to limit oxidation of the materials being processed and/or to inhibit other undesired chemical reactions, such as nitridation. In one embodiment of an apparatus incorporating a chamber, the pressure within the chamber is maintained at less than atmospheric pressure, such as from about 0.1 to about 0.0001 torr, or from about 0.01 to about 0.001 torr. In various other embodiments, the overall system pressure may be regulated to suppress volatilization and evaporation of alloy constituents as described above.

Molten alloy particles produced by impinging electrons on molten material according to the present disclosure generally are highly negatively charged. Certain embodiments described herein also include means to pre-charge molten material with a negative charge, prior to impinging electrons on and atomizing the molten material. There exists a tendency for the negatively charged particles/material to accelerate toward nearby structures held at ground potential. Such structures may include chamber walls and other apparatus components adjacent the molten material's path of travel downstream of the melting assembly. In certain non-limiting embodiments of an apparatus according the present disclosure, the atomizing assembly of the apparatus includes plates or other suitably-shaped structures held at negative potential and disposed so as to deflect negatively charged particles/material and inhibit undesirable acceleration of the particles/material toward the chamber walls and/or other structures held at ground potential.

Accordingly, certain embodiments of an apparatus constructed according to the present disclosure may include a melting assembly, wherein molten alloy is generated by the melting assembly during operation of the apparatus. Each such apparatus also includes an electron beam atomizing assembly to atomize the molten material and generate molten alloy particles, and a field generating assembly, which generates one or more electromagnetic and/or electrostatic fields between the atomizing assembly and a collector and influences at least one of the acceleration, speed, and direction of the particles as they traverse all or a portion of the distance between the atomizing assembly and the collector.

Optionally, the apparatus further includes means to generate one or more non-equilibrium plasmas for transferring heat to or from the molten alloy particles after they are generated by the atomizing assembly, but before they are collected as a solid workpiece such as an ingot, for example. Alternatively, or in addition, embodiments of an apparatus according to the present disclosure may generate one or more non-equilibrium plasmas to transfer heat to or from the molten alloy after it is collected on or in the collector, or is applied to a preform developing on or in the collector.

Figure 18:
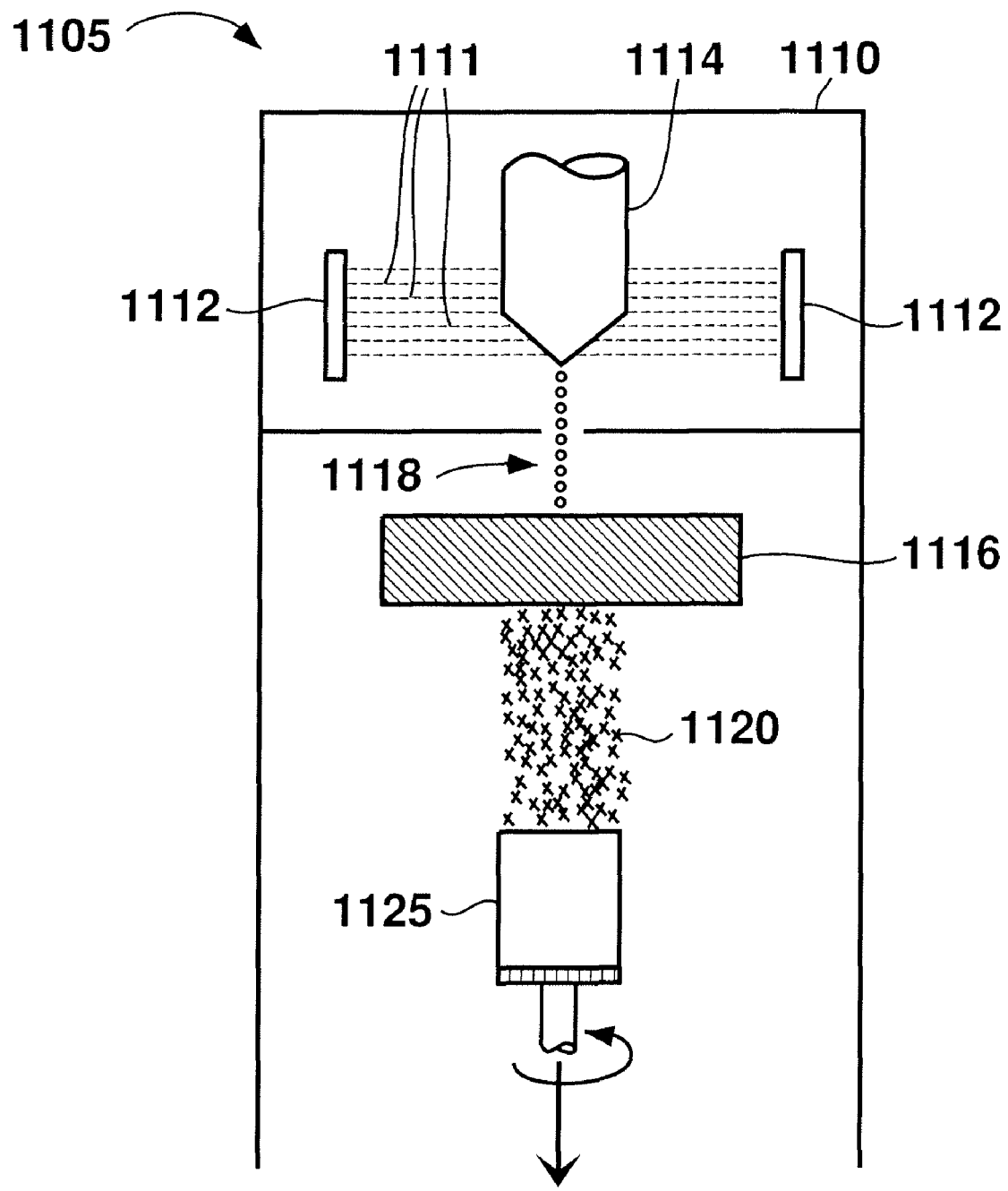
FIG. 18 schematically illustrates a non-limiting embodiment of a melting assembly that may be included in embodiments of apparatus constructed according to the present disclosure.

FIG. 18 illustrates use of an electron beam melting apparatus as the melting assembly producing molten alloy that is fed to the electron beam atomizing assembly. In this embodiment, the electron beam melting assembly does not employ a cold hearth system. In this embodiment, the feedstock is melted by impinging high-energy electrons on the feedstock. Contamination of the molten product can be avoided by melting in a pressure-regulated melting chamber. Electron beam melting devices are described in greater detail above.

Referring to FIG. 18, melting assembly 1105 includes melting chamber 1110 surrounding the melting assembly's electron beam sources 1112 and the alloy feedstock 1114 that is being melted. The electron beam sources 1112 may be wire discharge ion plasma electron emitters generating electrons 111, which impinge on the feedstock 1114, heating and melting the feedstock to produce molten alloy droplets (or a stream of molten alloy) 1118. The molten alloy droplets 1118 fall from the melting feedstock and travel along a gravity flow path to an electron beam atomizing assembly 1116, pass through and are atomized into molten alloy particles 1120, which are influenced by one or more electromagnetic and/or electrostatic fields generated by a field generating assembly (not shown), and then pass onto a collector and develop an ingot 1125.

Figure 19:
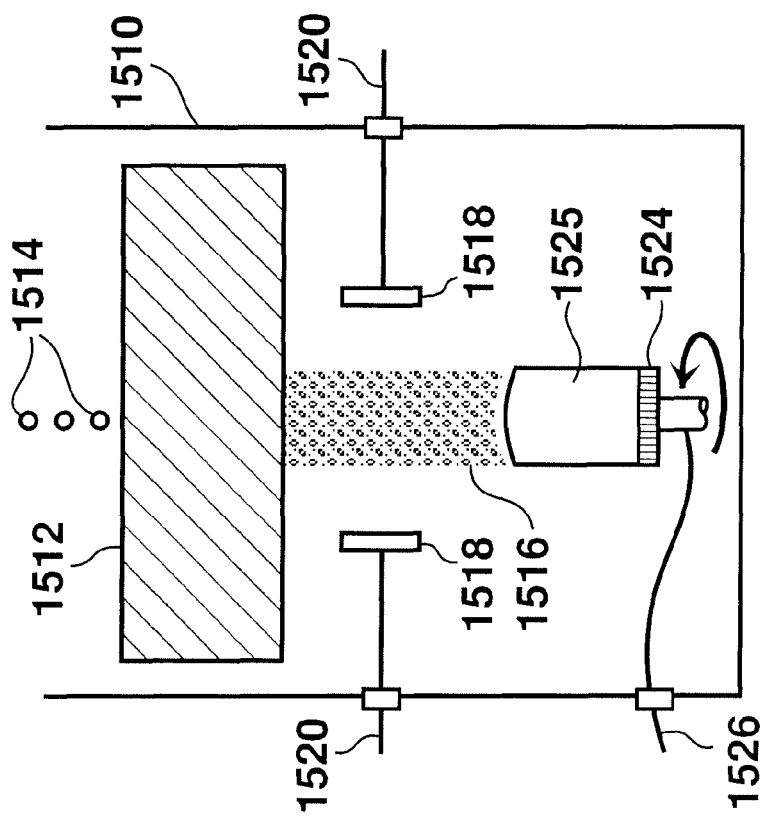
FIG. 19 schematically illustrates a non-limiting embodiment of a spray forming technique that may be used to collect solidified atomized material produced by embodiments of apparatus constructed according to the present disclosure.

FIG. 19 schematically illustrates the production of a spray formed solid ingot from an atomized molten alloy produced by electron beam atomization using an embodiment of an apparatus constructed according to the present disclosure. Atomization chamber 1510 encloses an electron beam atomizing assembly 1512. A melting assembly (not shown) may be, for example, one of the various melting assemblies discussed above. Droplets of molten alloy 1514 produced by the melting assembly (not shown) pass into the atomizing assembly 1512. The droplets of molten alloy 1514 are atomized within the atomizing assembly 1512 to form a spray of atomized molten alloy particles 1516. The atomized molten alloy particles 1516 pass through, interact with, and are influenced by one or more electromagnetic and/or electrostatic fields (not indicated) generated by devices 1518 of a field generating assembly. The devices 1518 are connected to a power source (not shown) by wires 1520 passing through the walls of the chamber 1510. The atomized molten alloy particles 1516 are directed onto rotating collector plate 1524 under influence of the field(s) generated by the field generating assembly to form an ingot 1525. The rotating collector plate 1524 can be withdrawn downwardly at a rate that maintains the deposition interface at a substantially constant distance from the atomizing assembly. To enhance yield and improve deposition density, the collector plate 1524 may be charged to a high positive potential by connecting the plate 1524 to a power supply (not shown) by wires 1526 passing through the wall of the chamber 1510.

Figure 20:
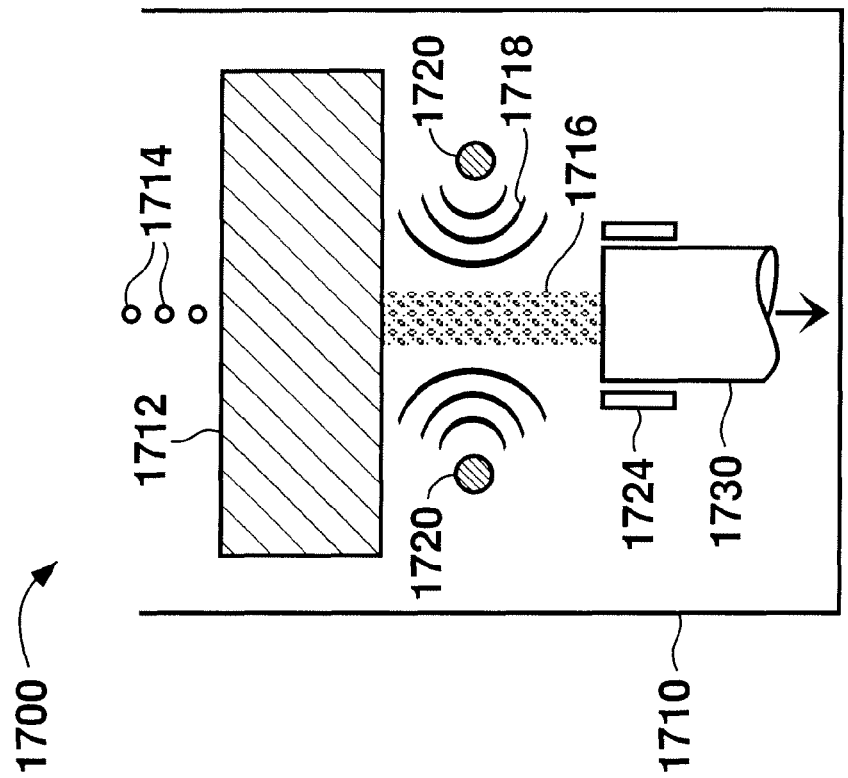
FIGS. 20 and 20A schematically illustrate non-limiting embodiments of an apparatus constructed according to the present disclosure wherein a cast article, such as an ingot, is produced in a mold by nucleated casting an atomized molten alloy produced by electron beam atomization.

FIG. 20 schematically illustrates a non-limiting embodiment of an apparatus 1700 constructed according to the present disclosure wherein a cast article is produced in a mold by nucleated casting an atomized molten alloy produced by electron beam atomization. Atomization chamber 1710 encloses an electron beam atomizing assembly 1712. A melting assembly (not shown) may be, for example, one of the various melting assemblies discussed above. A series of droplets of molten alloy 1714 produced by the melting assembly pass into the atomizing assembly 1712. The droplets of molten alloy 1714 are atomized within the atomizing assembly 1712 to form a spray of atomized molten alloy particles 1716. The atomized molten alloy particles 1716 pass through, interact with, and are influenced by the one or more electromagnetic and/or electrostatic fields 1718 generated by the electrically energized coil 1720 (shown sectioned) of a field generating assembly. The atomized molten material 1716 is directed into mold 1724 under influence of the field 1718 generated by the field generating assembly, and the resulting solid cast ingot 1730 is withdrawn from the mold 1724 by downward movement of the mold base (not shown). Optionally, the mold base may be adapted to rotate or otherwise translate in a suitable manner.

Figure 20A:
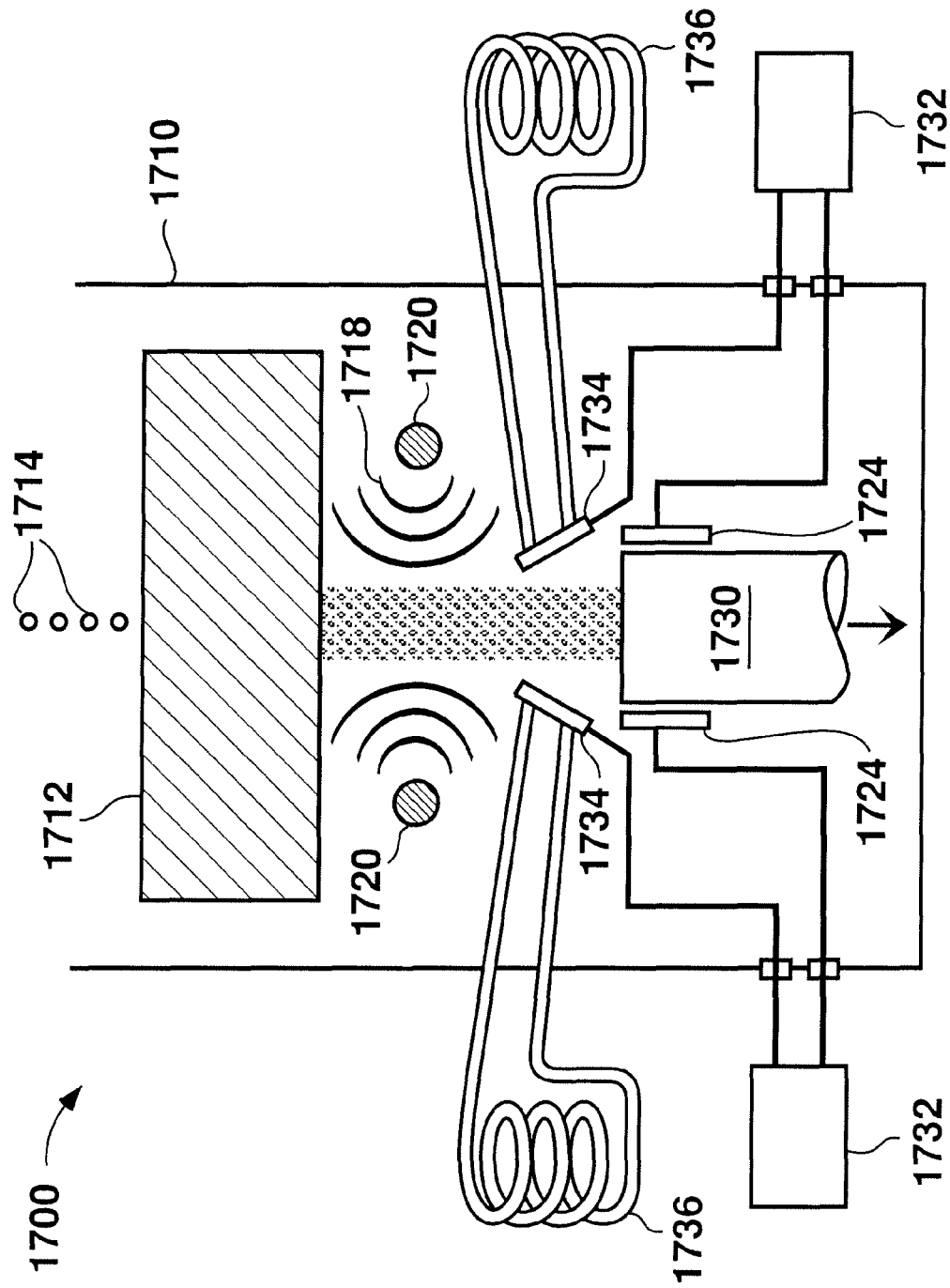

In an alternate non-limiting embodiment of apparatus 1700 shown in FIG. 20A, power supplies 1732 are provided and create a potential difference so as to form a non-equilibrium plasma emanating from the electrodes 1734. Heat is conducted by the plasma from the surface of the solidifying ingot 1730 to the electrodes 1734, which are cooled with a dielectric liquid that circulates through heat exchangers 1736 and the electrodes 1734.

Figure 21A:
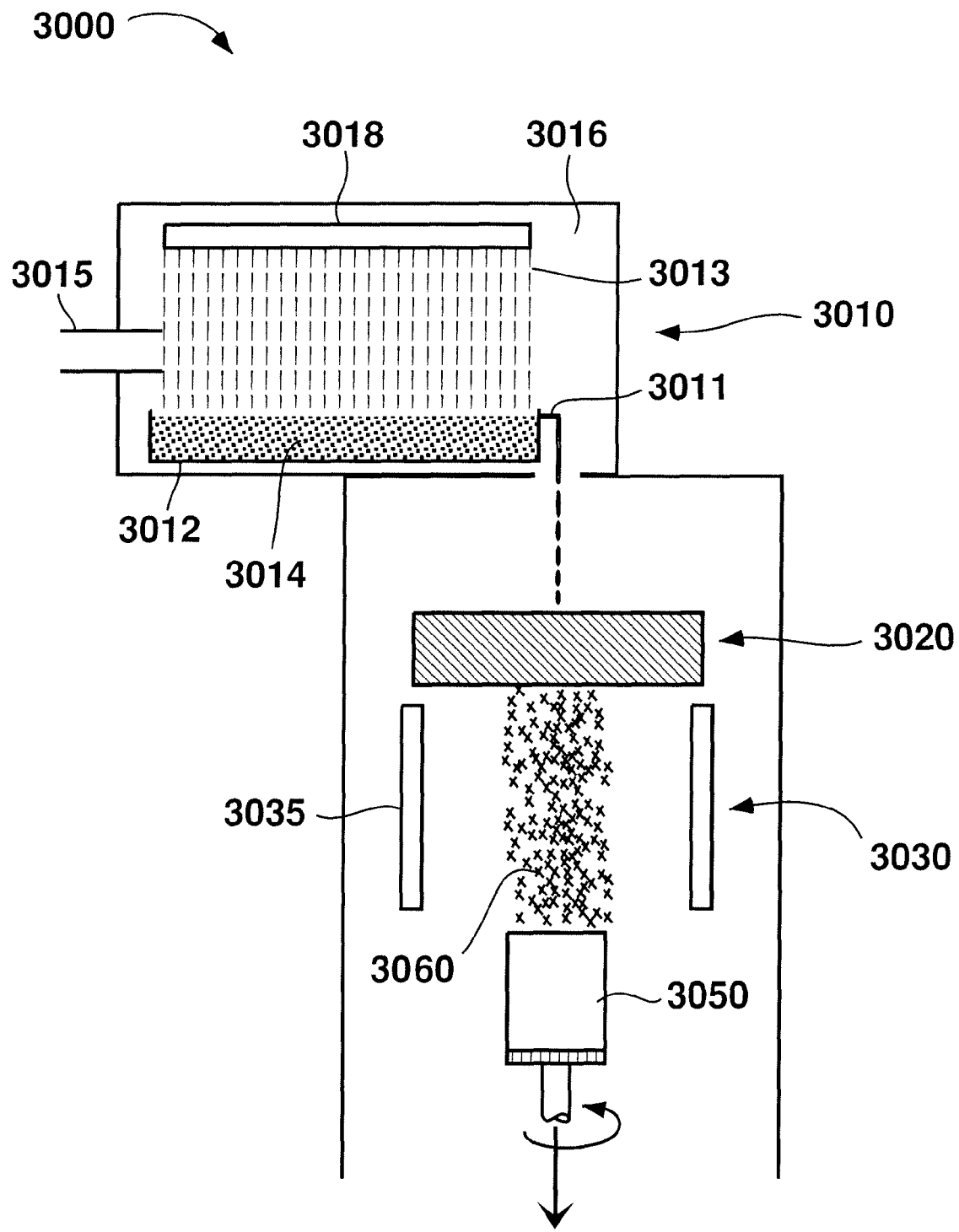
FIGS. 21A, 21B, and 21C schematically illustrate a non-limiting embodiment of an apparatus constructed according to the present disclosure wherein a superalloy ingot is produced by spray forming atomized superalloy produced by electron beam atomization of molten superalloy formed in a melting assembly including a wire-discharge ion plasma electron emitter.
Figure 21B:
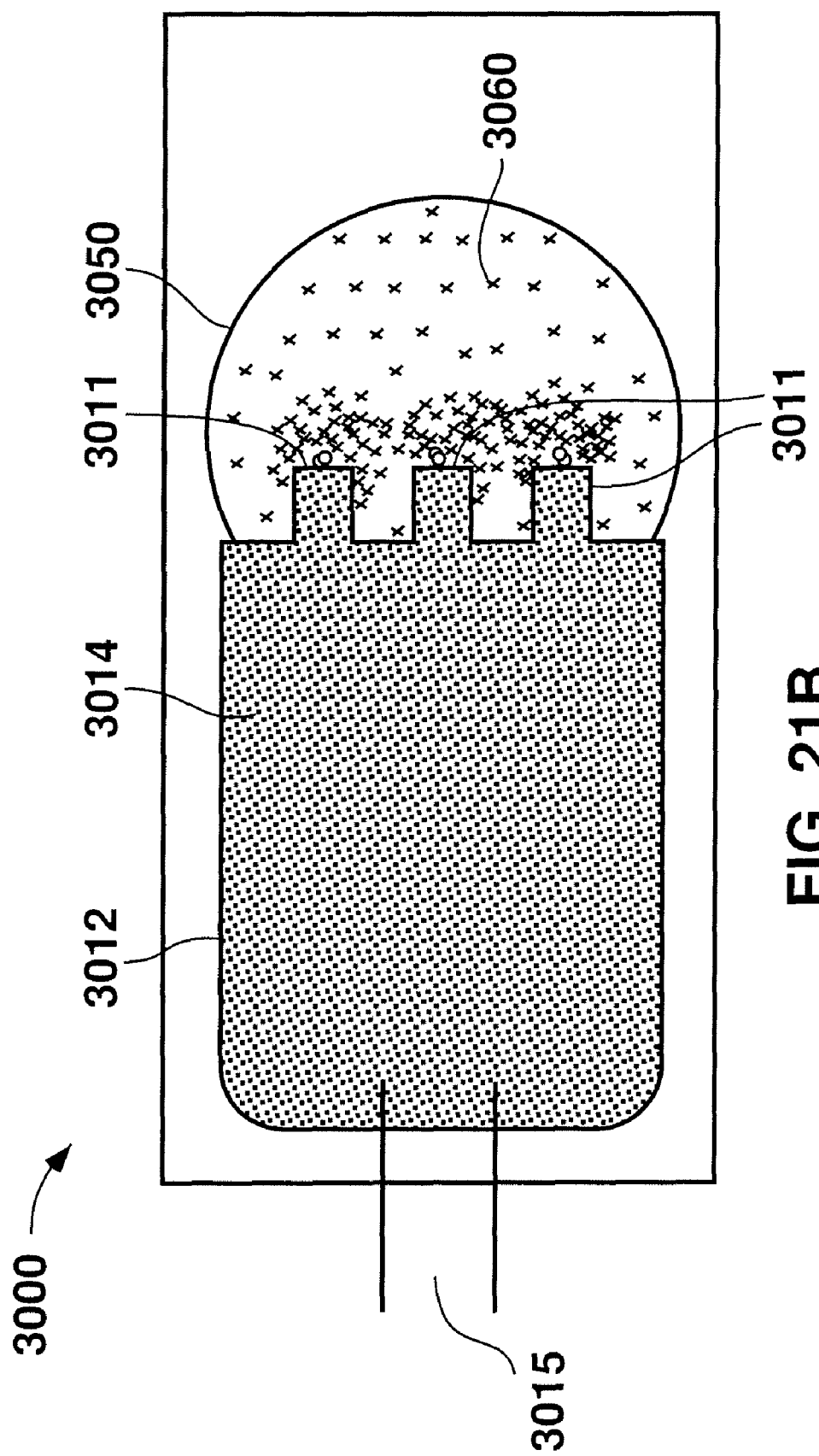
Figure 21C:
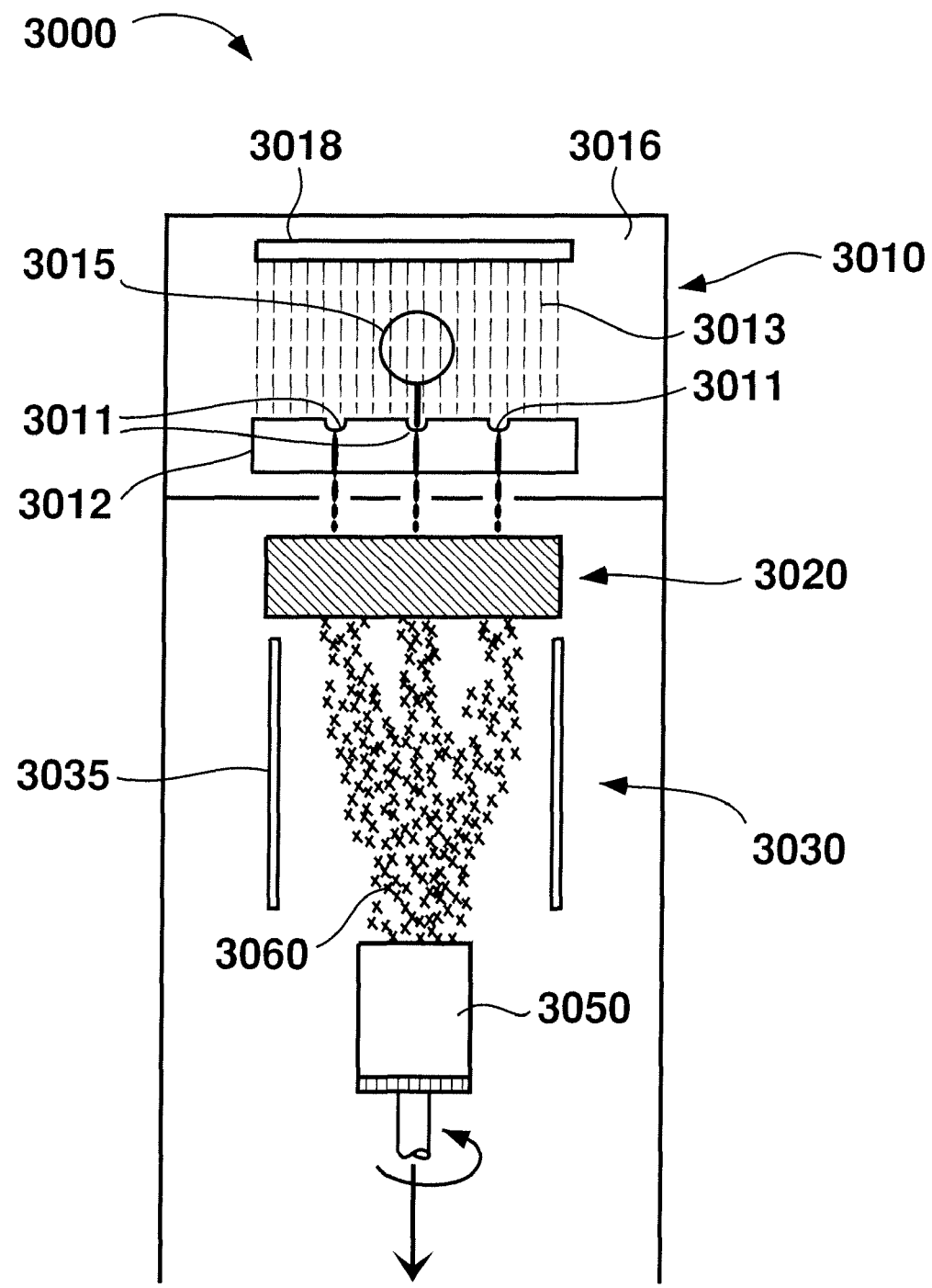

FIGS. 21A, 21B, and 21C schematically illustrate a side cross-sectional view, a top cross-sectional view, and a front cross-sectional view, respectively, of a non-limiting embodiment of an apparatus 3000 constructed according to the present disclosure wherein a superalloy ingot 3050 is produced by spray forming molten atomized superalloy particles 3060 produced by electron beam atomization of molten superalloy formed in a melting assembly 3010 including at least one wire-discharge ion plasma electron emitter 3018.

Referring to FIGS. 21A, 21B, and 21C, the apparatus 3000 for producing large diameter superalloy ingots includes a melting assembly 3010, an atomizing assembly 3020, a field generating assembly 3030, and a collector configured to develop a large diameter superalloy ingot 3050 spray formed onto a suitable collector. Material feed inlet 3015 facilitates the introduction of suitable feedstock into pressure controlled melting chamber 3016 of melting assembly 3010. Feedstock may include any suitable charge, including, but not limited to ingot, sponge, scrap, bar, rod, wire, slab, billet, powder and the like. In various embodiments, the feedstock comprises materials that will produce a molten alloy having nickel-base superalloy chemistry. The wire-discharge ion plasma electron emitter 3018 generates electrons 3013 having suitable energy to melt and maintain the molten state of the superalloy charge or feedstock. The electrons 3013 are directed to contact the molten alloy 3014 in the cold hearth 3012 in a wide area fashion that minimizes localized over-heating of the molten superalloy, thereby reducing undesired volatilization and evaporation of certain elements comprising the superalloy chemistry. The melting chamber is also operated at a pressure which inhibits evaporation of volatile elements as described above.

The molten superalloy 3014 exits the hearth 3012 through multiple outlets 3011, resulting in multiple streams of molten superalloy that may flow from the melting chamber 3016 and melting apparatus 3010 to the atomizing apparatus 3020. In atomizing apparatus 3020, the molten superalloy is impinged with electrons from a suitable electron beam source, which increases the localized charge density in the molten alloy to a level at which the energy exceeds the surface energy of the molten superalloy. Consequently, the molten superalloy breaks apart into smaller droplets or molten particles 3060. The use of multiple streams facilitates the development of large diameter (e.g., greater than 36 inches) superalloy ingots. The multiple molten superalloy streams exiting the melting assembly 3010 may enter a single atomizing apparatus 3020. Alternatively, the multiple molten superalloy streams may enter separate, respective atomizing assemblies (not shown). In addition, within any given atomizing assembly, the molten superalloy stream may be subjected to multiple electron beams (in a serial and/or parallel fashion) in order to produce molten superalloy particles having desired sizes and properties.

The atomized particles 3060 exit the atomizing apparatus 3020 and enter the field generating apparatus 3030. The field generating apparatus 3030 comprises field generating means 3035. The field generating means 3035 generate at least one of an electrostatic and/or an electromagnetic field that influences the at least one of the acceleration, speed, and direction of the atomized particles 3060. The field(s) direct atomized particles 3060 to a collector on which a large diameter superalloy ingot 3050 is developed.

The use of multiple streams 3011 of molten alloy exiting the melting apparatus 3010 and configured to feed one or more atomizing assemblies 3020 facilitates improved control over the quantity and properties of the atomized and deposited molten alloy. In various embodiments, such control will allow for the deposition of molten alloy particles onto an ingot preform under steady growth conditions in a spray forming operation. This is because more material is generally required to be deposited at the outside edge of the ingot than at the center of the ingot to maintain a steady and even growth rate. In various embodiments, the multiple streams of molten alloy exiting the melting apparatus may be configured to provide feed to one or more atomizing assemblies, and in turn, one or more field generating assemblies to produce large diameter ingots, for example superalloy ingots having diameters greater than 30 inches and preferably greater than 36 inches.

The methods and apparatus described herein are useful in processing alloys. As used herein, the term "alloy" refers both to pure metals and to alloys. Thus, as non-limiting examples, "alloy" includes, for example, iron, cobalt, nickel, aluminum, titanium, niobium, zirconium, copper, tungsten, molybdenum, tantalum, and alloys of any of these metals, stainless steels, and nickel-base and cobalt-base superalloys. Particular non-limiting examples of nickel-base superalloys that may be processed using methods and apparatus according to the present disclosure include Alloy 718, Alloy 706, Alloy 600, Alloy 625, Alloy 720, Waspaloy, IN 100 (UNS 13100), Rene 88, and 718Plus™ alloy (UNS N07818) (available from ATI Allvac, Monroe, N.C.). Particular non-limiting examples of titanium alloys that may be processed using methods and apparatus according to the present disclosure include Ti-6Al-4V, T-17, Ti-5-5-5-3, and TiAl alloys.

The apparatus and methods described herein are particularly applicable to producing large diameter ingots of an alloy having the following broad composition, all in weight percentages: about 50.0 to about 55.0 nickel; about 17 to about 21.0 chromium; 0 up to about 0.08 carbon; 0 up to about 0.35 manganese; 0 up to about 0.35 silicon; about 2.8 up to about 3.3 molybdenum; at least one of niobium and tantalum, wherein the sum of niobium and tantalum is about 4.75 up to about 5.5; about 0.65 up to about 1.15 titanium; about 0.20 up to about 0.8 aluminum; 0 up to about 0.006 boron; and iron and incidental impurities.

Using various features described above, it would be readily apparent to one of ordinary skill in the art that the foregoing prophetic embodiments could be implemented as provided. Moreover, the foregoing embodiments may be modified so as to combine different elements described herein and provide additional embodiments of apparatus and methods according to the present disclosure.

Although the foregoing description has necessarily presented only a limited number of embodiments, those of ordinary skill in the relevant art will appreciate that various changes in the apparatus and methods and other details of the examples that have been described and illustrated herein may be made by those skilled in the art, and all such modifications will remain within the principle and scope of the present disclosure as expressed herein and in the appended claims. It will also be appreciated by those skilled in the art that changes could be made to the embodiments above without departing from the broad inventive concept thereof. It is understood, therefore, that this invention is not limited to the particular embodiments disclosed, but it is intended to cover modifications that are within the principle and scope of the invention, as defined by the claims.

What is claimed is:

1. A method for producing large diameter alloy ingots comprising:
   introducing a material comprising at least one of a metal and a metallic alloy into a pressure-regulated chamber in a melting assembly;
   subjecting the material to a three-dimensional wide-area electron field within the pressure-regulated chamber to heat the material to a temperature above the melting temperature of the material to form a molten alloy;
   providing at least one stream of molten alloy from the pressure-regulated chamber in the melting assembly;
   feeding the at least one stream of molten alloy into an atomizing assembly wherein electrons are impinged on the molten alloy to atomize the molten alloy and produce molten alloy particles;
   producing at least one of an electrostatic field and an electromagnetic field, wherein the particles of the molten alloy are influenced by the field; and
   depositing the particles of the molten alloy onto a collector in a spray forming operation to form an alloy ingot.

2. The method of claim 1, wherein the material comprises at least one of aluminum, boron, carbon, copper, manganese, molybdenum, niobium, tantalum, chromium, titanium, titanium alloys, tungsten, niobium, tantalum, platinum, palladium, zirconium, iridium, nickel, nickel-base alloys, iron, iron base alloys, cobalt, and cobalt base alloys.

3. The method of claim 2, comprising adding at least one alloying additive to the material.

4. The method of claim 1, wherein the material is a nickel-base superalloy.

5. The method of claim 4, wherein the material comprises
   about 50.0 to about 55.0 weight percent nickel;
   about 17 to about 21.0 weight percent chromium;
   0 up to about 0.08 weight percent carbon;
   0 up to about 0.35 weight percent manganese;
   0 up to about 0.35 weight percent silicon;
   about 2.8 up to about 3.3 weight percent molybdenum;
   at least one of niobium and tantalum wherein the sum of niobium and tantalum is about 4.75 up to about 5.5 weight percent;
   about 0.65 up to about 1.15 weight percent titanium;
   about 0.20 up to about 0.8 weight percent aluminum;
   0 up to about 0.006 weight percent boron; and
   iron and incidental impurities.

6. The method of claim 4, wherein the nickel-base superalloy is one of Alloy 718, Alloy 706, Alloy 600, Alloy 625, Alloy 720, and Waspaloy.

7. The method of claim 4, wherein the alloy ingot has a diameter greater than 30 inches (762 mm).

8. The method of claim 4, wherein the alloy ingot has a diameter of at least 36 inches (914 mm).

9. The method of claim 4, wherein the weight of the alloy ingot is greater than 21,500 lbs (9772 kg).

10. The method of claim 1, wherein the three-dimensional wide area electron field is generated by a wire-discharge ion plasma electron emitter.

11. The method of claim 10, wherein the material is a nickel-base superalloy.

12. The method of claim 11, wherein the material comprises
    about 50.0 to about 55.0 weight percent nickel;
    about 17 to about 21.0 weight percent chromium;
    0 up to about 0.08 weight percent carbon;
    0 up to about 0.35 weight percent manganese;
    0 up to about 0.35 weight percent silicon;
    about 2.8 up to about 3.3 weight percent molybdenum;
    at least one of niobium and tantalum wherein the sum of niobium and tantalum is about 4.75 up to about 5.5 weight percent;
    about 0.65 up to about 1.15 weight percent titanium;
    about 0.20 up to about 0.8 weight percent aluminum;
    0 up to about 0.006 weight percent boron; and
    iron and incidental impurities.

13. The method of claim 11, wherein the nickel-base superalloy is one of Alloy 718, Alloy 706, Alloy 600, Alloy 625, Alloy 720, and Waspaloy.

14. The method of claim 11, wherein the alloy ingot has a diameter of at least 36 inches (914 mm).

15. The method of claim 10, wherein a plurality of streams of molten alloy are provided from the pressure-regulated chamber.

16. The method of claim 15, wherein each of the plurality of streams of molten alloy is respectively fed to a separate atomizing assembly.

17. The method of claim 10, wherein, prior to impinging electrons on the molten alloy, a negative charge is induced in the molten alloy.

18. The method of claim 10, wherein the collector is charged to enhance yield and improve deposition density.

19. The method of claim 10, wherein the particles of molten alloy interact with and are influenced by the at least one field such that at least one of acceleration, speed, and direction of the particles of the molten alloy is affected in a predetermined manner.

20. The method of claim 10, wherein a pressure within the pressure-regulated chamber is maintained at greater than 40 μm Hg, thereby decreasing or eliminating undesirable evaporation of volatile elements from the material during heating in the pressure-regulated chamber.

21. The method of claim 10, wherein a pressure within the pressure-regulated chamber is maintained at greater than 300 μm Hg, thereby decreasing or eliminating undesirable evaporation of volatile elements from the material during heating in the pressure-regulated chamber.

22. The method of claim 1, wherein the at least one stream of molten alloy from the pressure-regulated chamber in the melting assembly is at least one of a continuous flow of molten alloy and a series of droplets of molten alloy.

23. The method of claim 1, wherein a plurality of streams of molten alloy are provided from the pressure-regulated chamber.

24. The method of claim 23, wherein each of the plurality of streams of molten alloy is respectively fed to a separate atomizing assembly.

25. The method of claim 1, wherein, prior to impinging electrons on the molten alloy, a negative charge is induced in the molten alloy.

26. The method of claim 1, wherein the collector is charged to enhance yield and improve deposition density.

27. The method of claim 1, wherein the particles of molten alloy interact with and are influenced by the at least one field such that at least one of acceleration, speed, and direction of the particles of the molten alloy is affected in a predetermined manner.

28. The method of claim 1, wherein a pressure within the pressure-regulated chamber is maintained at greater than 40 μm Hg, thereby decreasing or eliminating undesirable evaporation of volatile elements from the material during heating in the pressure-regulated chamber.

29. The method of claim 1, wherein a pressure within the pressure-regulated chamber is maintained at greater than 300 μm Hg, thereby decreasing or eliminating undesirable evaporation of volatile elements from the material during heating in the pressure-regulated chamber.

* * * * *